(12) United States Patent
Kim et al.

(10) Patent No.: US 12,159,585 B2
(45) Date of Patent: Dec. 3, 2024

(54) DISPLAY DEVICE

(71) Applicant: Samsung Display Co., LTD., Yongin-si (KR)

(72) Inventors: Keun Woo Kim, Yongin-si (KR); Hye Na Kwak, Yongin-si (KR); Chan Yeob Seol, Yongin-si (KR); Bum Mo Sung, Yongin-si (KR); Ji Yeong Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/448,817

(22) Filed: Aug. 11, 2023

(65) Prior Publication Data

US 2024/0169918 A1  May 23, 2024

(30) Foreign Application Priority Data

Nov. 18, 2022  (KR) .......................... 10-2022-0155775

(51) Int. Cl.
*G09G 3/3233* (2016.01)
*G09G 3/3291* (2016.01)

(52) U.S. Cl.
CPC ......... *G09G 3/3233* (2013.01); *G09G 3/3291* (2013.01)

(58) Field of Classification Search
CPC .............. G09G 3/3233; G09G 3/3291; G09G 2300/0426; G09G 2300/0819;
(Continued)

(56) References Cited

U.S. PATENT DOCUMENTS 9,772,708 B2   9/2017   Kim et al.
10,083,991 B2  9/2018   Toyotaka et al.
(Continued)

FOREIGN PATENT DOCUMENTS

CN        113363290 A     9/2021
KR   10-2005-0081227 A    8/2005
(Continued)

OTHER PUBLICATIONS

Billah, et al. Effect of Grain Boundary Protrusion on Electrical Performance of Low Temperature Polycrystalline Silicon Thin Film Transistors; Journal of the Electron Device Society; 2019, pp. 503-511 vol. 7, 9pp.

(Continued)

*Primary Examiner* — Antonio Xavier
(74) *Attorney, Agent, or Firm* — Lewis Roca Rothgerber Christie LLP

(57) ABSTRACT

A display device includes: a light emitting element on a substrate; a third-first transistor and a third-second transistor connected in series between a gate electrode of the first transistor and a drain electrode of the first transistor; a first metal layer on the substrate and comprising a gate electrode of the third-first transistor and a gate electrode of the third-second transistor; a hydrogen passivation layer on the first metal layer; a semiconductor region of each of a first transistor, the third-first transistor, and the third-second transistor on the hydrogen passivation layer; a gate electrode on the capping layer; a first bias electrode on a same layer as the gate electrode of the first transistor and overlapping the semiconductor region of the third-first transistor; and a second bias electrode on a same layer as the first bias electrode and overlapping the semiconductor region of the third-second transistor.

20 Claims, 11 Drawing Sheets

(58) Field of Classification Search
CPC ..... G09G 2310/061; G09G 2300/0842; G09G 2300/0861; H10K 59/10; H10K 59/1213; H10K 59/131; H01L 29/78606; H01L 29/78636
See application file for complete search history.

(56) References Cited

U.S. PATENT DOCUMENTS

| | | |
|---|---|---|
| 11,552,149 B2 | 1/2023 | Kim et al. |
| 2016/0268319 A1* | 9/2016 | Long ................... H01L 27/1288 |
| 2018/0090620 A1* | 3/2018 | Morosawa .......... H01L 29/7869 |
| 2021/0090494 A1* | 3/2021 | Hwang ................ G09G 3/3291 |
| 2021/0200366 A1* | 7/2021 | Bok ....................... H10K 77/00 |
| 2021/0280652 A1 | 9/2021 | Kim et al. |
| 2021/0335953 A1* | 10/2021 | Kim ..................... H10K 59/131 |

FOREIGN PATENT DOCUMENTS

| | | |
|---|---|---|
| KR | 10-2008-0041426 A | 5/2008 |
| KR | 10-2016-0053239 A | 5/2016 |
| KR | 10-2017-0071679 A | 6/2017 |
| KR | 10-2020-0075318 A | 6/2020 |
| KR | 10-2021-0034135 A | 3/2021 |
| KR | 10-2021-0086907 A | 7/2021 |
| KR | 10-2021-0113513 A | 9/2021 |
| KR | 10-2021-0131509 A | 11/2021 |

OTHER PUBLICATIONS

International Search Report dated Oct. 13, 2023, issued in PCT/KR2023/009830 (3 pages).

* cited by examiner

DISPLAY DEVICE

CROSS-REFERENCE TO RELATED APPLICATION

The present application claims priority to and the benefit of Korean Patent Application No. 10-2022-0155775 filed on Nov. 18, 2022, in the Korean Intellectual Property Office, the entire content of which is incorporated by reference.

BACKGROUND

1. Field

Aspects of some embodiments of the present disclosure relate to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. In the display device, because each of pixels of a display panel includes a light emitting element capable of emitting light by itself, an image can be displayed without a backlight unit providing light to the display panel.

The display device includes a plurality of pixels, data lines and gate lines connected to the plurality of pixels, a data driver that supplies a data voltage to the data lines, and a gate driver that supplies a gate signal to the gate lines. The data driver and the gate driver may drive a plurality of pixels according to a predetermined frequency.

The above information disclosed in this Background section is only for enhancement of understanding of the background and therefore the information discussed in this Background section does not necessarily constitute prior art.

SUMMARY

Aspects of the present disclosure provide a display device capable of improving a driving range of a first transistor and improving off current characteristics and low frequency characteristics of transistors electrically connected to the gate electrode of the first transistor.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some embodiments, a display device comprises a light emitting element on a substrate, a first transistor configured to control a driving current flowing through the light emitting element, a second transistor configured to supply a data voltage to a source electrode of the first transistor, a third-first transistor and a third-second transistor connected in series between a gate electrode of the first transistor and a drain electrode of the first transistor, a first metal layer on the substrate and comprising a gate electrode of the third-first transistor and a gate electrode of the third-second transistor, a hydrogen passivation layer on the first metal layer, a semiconductor region of each of the first transistor, the third-first transistor, and the third-second transistor on the hydrogen passivation layer, a capping layer on the semiconductor region of the first transistor, a gate electrode of the first transistor on the capping layer, a first bias electrode on the same layer as the gate electrode of the first transistor and overlapping the semiconductor region of the third-first transistor, and a second bias electrode on the same layer as the first bias electrode and overlapping the semiconductor region of the third-second transistor.

According to some embodiments, the hydrogen passivation layer may be in directly contact with a bottom surface of the semiconductor region of each of the first transistor, the third-first transistor, and the third-second transistor.

According to some embodiments, the first and second bias electrodes may be electrically connected to a driving voltage line to receive a driving voltage.

According to some embodiments, the display device may further comprise a fourth-first transistor and a fourth-second transistor connected in series between the gate electrode of the first transistor and a first initialization voltage line, and a second metal layer on the same layer as the first metal layer and comprising a gate electrode of the fourth-first transistor and a gate electrode of the fourth-second transistor.

According to some embodiments, the gate electrode of the second transistor may receive a first gate signal from a first gate line. The first metal layer may receive a second gate signal different from the first gate signal from a second gate line.

According to some embodiments, the second metal layer may receive a third gate signal different from the first and second gate signals from a third gate line.

According to some embodiments, the display device may further comprise a third bias electrode on the same layer as the second bias electrode and overlapping a semiconductor region of the fourth-first transistor, and a fourth bias electrode on the same layer as the third bias electrode and overlapping a semiconductor region of the fourth-second transistor.

According to some embodiments, the third and fourth bias electrodes may be electrically connected to a driving voltage line to receive a driving voltage.

According to some embodiments, the display device may further comprise a fifth transistor between the source electrode of the first transistor and a driving voltage line, a sixth transistor between the drain electrode of the first transistor and the light emitting element, and a seventh transistor between a first electrode of the light emitting element and a second initialization voltage line.

According to some embodiments, the display device may further comprise an eighth transistor between the source electrode of the first transistor and a bias voltage line.

According to some embodiments, the first transistor may comprise a protrusion formed on a semiconductor region, a source electrode, and a drain electrode of the first transistor. The capping layer may cover the protrusion of the first transistor.

According to some embodiments, the display device may further comprise a gate insulating layer between the capping layer and the gate electrode of the first transistor. The capping layer may include a silicon oxide layer or an amorphous silicon layer. The gate insulating layer may include at least one of a silicon nitride layer, a silicon oxynitride layer, a silicon oxide layer, a titanium oxide layer, an aluminum oxide layer, and an amorphous silicon layer.

According to some embodiments, a display device comprises a light emitting element on a substrate, a first transistor configured to control a driving current flowing through the light emitting element, a second transistor configured to supply a data voltage to a source electrode of the first transistor, a third-first transistor and a third-second transistor connected in series between a gate electrode of the first transistor and a drain electrode of the first transistor, a first metal layer on the substrate and comprising a gate electrode of the third-first transistor and a gate electrode of the third-second transistor, a hydrogen passivation layer on the first metal layer, a semiconductor region of each of the first transistor, the third-first transistor, and the third-second transistor on the hydrogen passivation layer, a capping layer on the semiconductor region of the first transistor, a gate electrode of the first transistor on the capping layer, a first bias electrode on the same layer as the gate electrode of the first transistor and overlapping the semiconductor region of the third-first transistor, and a second bias electrode on the same layer as the first bias electrode, overlapping the semiconductor region of the third-second transistor, and electrically connected to the first metal layer.

According to some embodiments, the first bias electrode may be electrically connected to a driving voltage line to receive a driving voltage.

According to some embodiments, the gate electrode of the second transistor may receive a first gate signal from a first gate line. The first metal layer and the second bias electrode may receive a second gate signal different from the first gate signal from a second gate line.

According to some embodiments, the display device may further comprise a second metal layer on the same layer as the first metal layer and overlapping the semiconductor region of the first transistor.

According to some embodiments, the second metal layer may be electrically connected to a driving voltage line to receive a driving voltage.

According to some embodiments, a display device comprises a light emitting element on a substrate, a first transistor configured to control a driving current flowing through the light emitting element, a second transistor configured to supply a data voltage to a source electrode of the first transistor, a third-first transistor and a third-second transistor connected in series between a gate electrode of the first transistor and a drain electrode of the first transistor, a first metal layer on the substrate and comprising a gate electrode of the third-first transistor and a gate electrode of the third-second transistor, a semiconductor region of each of the first transistor, the third-first transistor, and the third-second transistor on the first metal layer, a gate electrode of the first transistor on the semiconductor region of the first transistor, and a first bias electrode on the same layer as the gate electrode of the first transistor, overlapping the semiconductor region of the third-first transistor, and electrically connected to a driving voltage line. The gate electrode of the first transistor is electrically connected to a source electrode of the third-first transistor on the same layer as the semiconductor region of the third-first transistor.

According to some embodiments, the display device may further comprise a fourth-first transistor and a fourth-second transistor connected in series between the gate electrode of the first transistor and a first initialization voltage line, and a second metal layer on the same layer as the first metal layer and comprising a gate electrode of the fourth-first transistor and a gate electrode of the fourth-second transistor. The gate electrode of the first transistor may be electrically connected to the source electrode of the fourth-first transistor on the same layer as the semiconductor region of the fourth-first transistor.

According to some embodiments, the display device may further comprise a third metal layer on the same layer as the first metal layer, overlapping the semiconductor region of the first transistor, and electrically connected to a driving voltage line.

In accordance with the display device according to some embodiments, because a capping layer covering the protrusion of the first transistor is included, the driving range of the first transistor may be relatively improved. The transistors electrically connected to the gate electrodes of the first transistors may include a gate electrode under a semiconductor region and a bias electrode on the semiconductor region, and a hydrogen passivation layer may be in direct contact with the bottom surface of the semiconductor region. Therefore, in the display device, because the hydrogen passivation layer is included, it may be possible to eliminate interface defects of the transistors electrically connected to the gate electrodes of the first transistors, thereby relatively improving off current characteristics and low frequency characteristics.

However, characteristics of embodiments of the present disclosure are not limited to those described above and various other characteristics are incorporated herein.

BRIEF DESCRIPTION OF THE DRAWINGS

The above and other aspects and features of embodiments according to the present disclosure will become more apparent by describing in more detail aspects of some embodiments thereof with reference to the attached drawings, in which.

DETAILED DESCRIPTION

Figure 1:
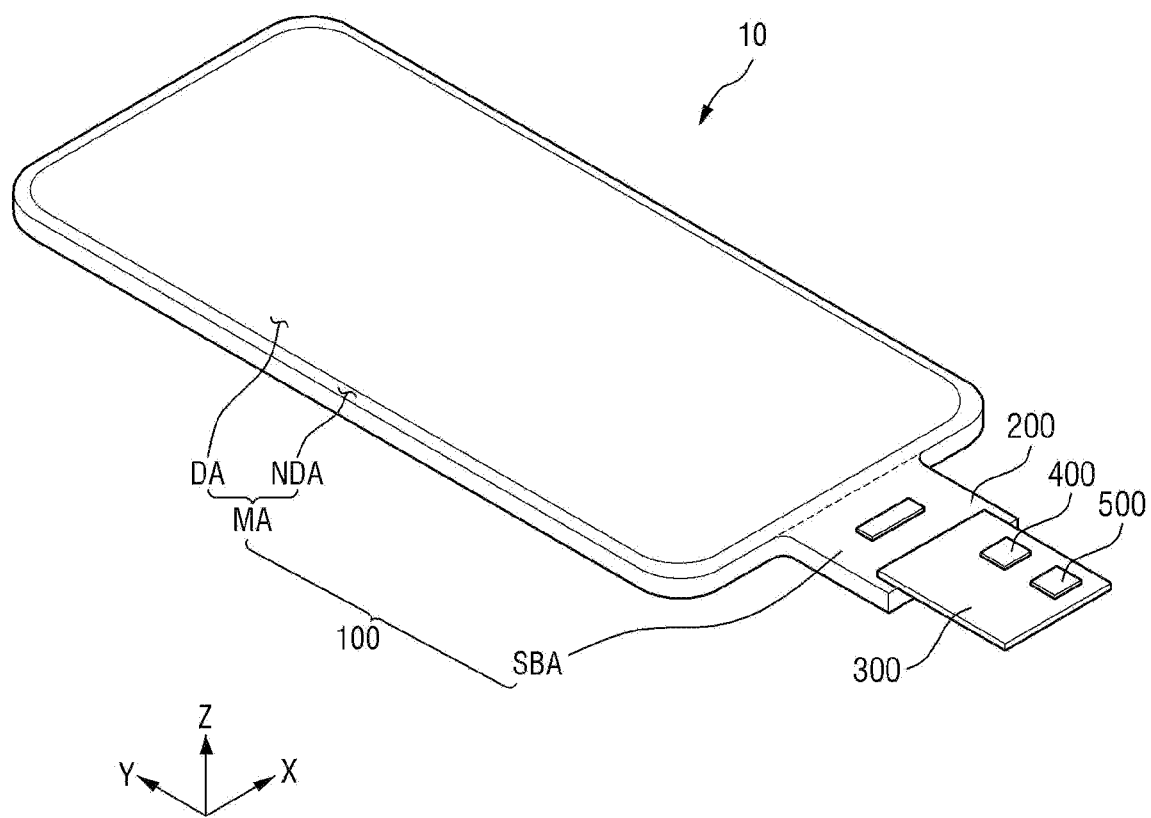
FIG. 1 is a perspective view showing a display device according to some embodiments.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of some embodiments may be used or implemented in other embodiments without departing from the spirit and scope of embodiments according to the present disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure is described with reference to the accompanying drawings.

FIG. 1 is a perspective view showing a display device according to some embodiments.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. Embodiments according to the present disclosure are not limited thereto, however For example, the display device 10 may be applied as a display unit of a television, a laptop, a monitor, a billboard, or an Internet-of-Things (IOT) device. For another example, the display device 10 may be applied to wearable devices such as a smart watch, a watch phone, a glasses type display, or a head mounted display (HMD).

The display device 10 may have a planar shape similar to a quadrilateral shape. For example, the display device 10 may have a shape similar to a quadrilateral shape, in a plan view, having short sides in an X-axis direction and long sides in a Y-axis direction. The corner where the short side in the X-axis direction and the long side in the Y-axis direction meet may be rounded to have a curvature (e.g., a set or predetermined curvature) or may be right-angled. The planar shape of the display device 10 is not limited to a quadrilateral shape, and may be formed in a shape similar to another polygonal shape, a circular shape, or elliptical shape.

The display device 10 may include a display panel 100, a display driver 200, a circuit board 300, a touch driver 400, and a power supply unit 500.

The display panel 100 may include a main region MA and a sub-region SBA.

The main region MA may include the display area DA including pixels configured to collectively display images and the non-display area NDA arranged around (e.g., in a periphery or outside a footprint of) the display area DA in a plan view. The display area DA may emit light from a plurality of emission areas or a plurality of opening areas. For example, the display panel 100 may include a pixel circuit including switching elements, a pixel defining layer defining an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, or a micro LED, but is not limited thereto.

The non-display area NDA may be an area outside the display area DA. The non-display area NDA may be defined as an edge area of the main region MA of the display panel 100. The non-display area NDA may include a gate driver that supplies gate signals to the gate lines, and fan-out lines that connect the display driver 200 to the display area DA.

The sub-region SBA may extend from one side of the main region MA. The sub-region SBA may include a flexible material which can be bent, folded or rolled. For example, when the sub-region SBA is bent, the sub-region SBA may overlap the main region MA in a thickness direction (Z-axis direction). The sub-region SBA may include the display driver 200 and the pad unit connected to the circuit board 300. Optionally, the sub-region SBA may be omitted, and the display driver 200 and the pad unit may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be located in the sub-region SBA, and may overlap the main region MA in the thickness direction (Z-axis direction) by bending the sub-region SBA. For another example, the display driver 200 may be mounted on the circuit board 300.

The circuit board 300 may be attached to the pad unit of the display panel 100 by using an anisotropic conductive film (ACF). Lead lines of the circuit board 300 may be electrically connected to a pad unit of the display panel 100. The circuit board 300 may be a flexible printed circuit board, a printed circuit board, or a flexible film such as a chip on film.

A touch driver 400 may be mounted on the circuit board 300. The touch driver 400 may be electrically connected to a touch sensing unit of the display panel 100. The touch driver 400 may supply a touch driving signal to a plurality of touch electrodes of the touch sensing unit and may sense an amount of change in capacitance between the plurality of touch electrodes. For example, the touch driving signal may be a pulse signal having a frequency (e.g., a set or predetermined frequency). The touch driver 400 may calculate whether an input is made and input coordinates based on an amount of change in capacitance between the plurality of touch electrodes. The touch driver 400 may be formed of an integrated circuit (IC).

The power supply unit 500 may be located on the circuit board 300 to supply a power voltage to the display driver 200 and the display panel 100. The power supply unit 500 may generate and supply a driving voltage to a driving voltage line, generate and supply an initialization voltage to an initialization voltage line, and generate and supply a common voltage to a common electrode common to light emitting elements of a plurality of pixels. For example, the driving voltage may be a high potential voltage for driving the light emitting element, and the common voltage may be a low potential voltage (e.g., ground) for driving the light emitting element.

Figure 2:
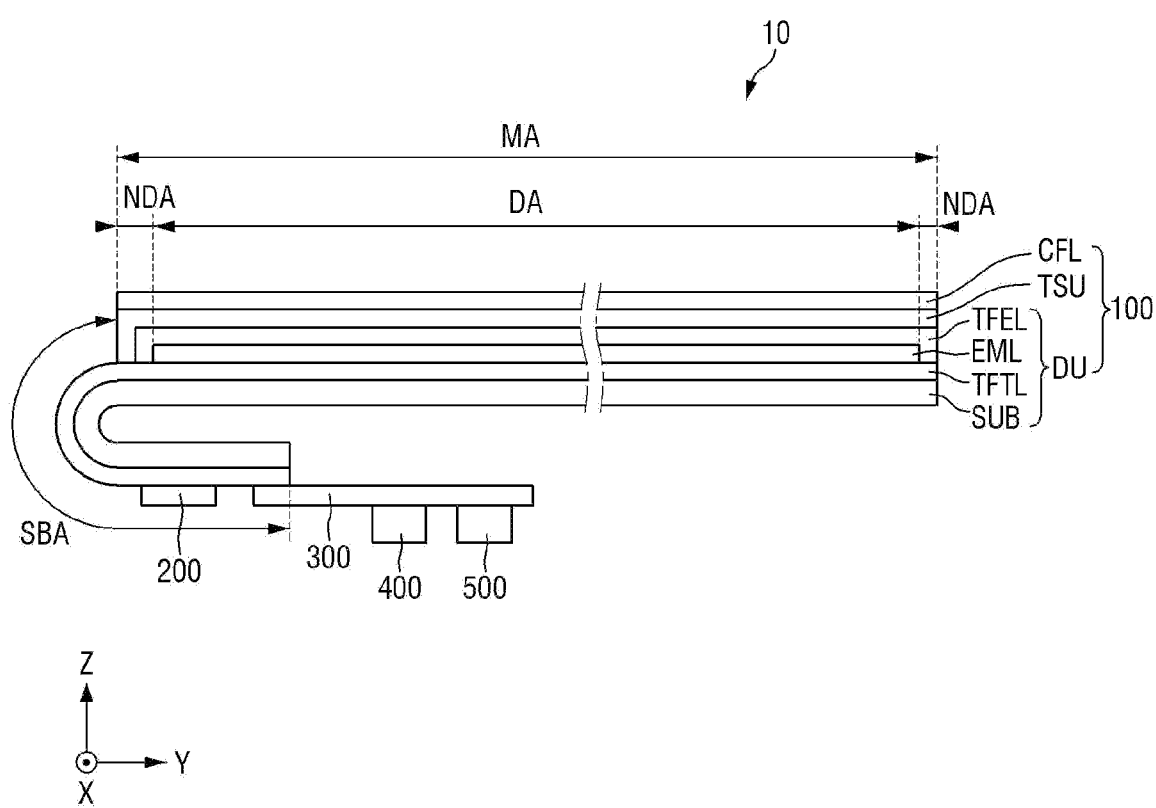
FIG. 2 is a cross-sectional view illustrating a display device according to some embodiments.

FIG. 2 is a cross-sectional view illustrating a display device according to some embodiments.

Referring to FIG. 2, the display panel 100 may include a display unit DU, a touch sensing unit TSU, and a color filter layer CFL. The display unit DU may include the substrate SUB, the thin film transistor layer TFTL, the light emitting element layer EML, and the encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but is not limited thereto. For another example, the substrate SUB may include a glass material or a metal material.

The thin film transistor layer TFTL may be located on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines that connect the display driver 200 to the data lines, and lead lines that connect the display driver 200 to the pad unit. Each of the thin film transistors may include a semiconductor region, a source electrode, a drain electrode, and a gate electrode. For example, when the gate driver is formed on one side of the non-display area NDA of the display panel 100, the gate driver may include thin film transistors.

The thin film transistor layer TFTL may be located in the display area DA, the non-display area NDA, and the sub-region SBA. Thin film transistors, gate lines, data lines, and power lines of each of the pixels of the thin film transistor layer TFTL may be located in the display area DA. Gate control lines and fan-out lines of the thin film transistor layer TFTL may be located in the non-display area NDA. The lead lines of the thin film transistor layer TFTL may be located in the sub-region SBA.

The light emitting element layer EML may be located on the thin film transistor layer TFTL. The light emitting element layer EML may include a plurality of light emitting elements in which a pixel electrode, a light emitting layer, and a common electrode are sequentially stacked to emit light, and a pixel defining layer defining pixels. The plurality of light emitting elements of the light emitting element layer EML may be located in the display area DA.

For example, the light emitting layer may be an organic light emitting layer including an organic material. The light emitting layer may include a hole transporting layer, an organic light emitting layer, and an electron transporting layer. When the pixel electrode receives a voltage (e.g., a set or predetermined voltage) through the thin film transistor of the thin film transistor layer TFTL and the common electrode receives the cathode voltage, holes and electrons may be transferred to the organic light emitting layer through the hole transporting layer and the electron transporting layer, respectively and may be combined with each other to emit light in the organic light emitting layer. For example, the pixel electrode may be an anode electrode, and the common electrode may be a cathode electrode, but embodiments according to the present disclosure are not limited thereto.

For another example, the plurality of light emitting elements may include a quantum dot light emitting diode including a quantum dot light emitting layer, an inorganic light emitting diode including an inorganic semiconductor, or a micro light emitting diode.

The encapsulation layer TFEL may cover the top surface and the side surface of the light emitting element layer EML, and may protect the light emitting element layer EML. The encapsulation layer TFEL may include at least one inorganic layer and at least one organic layer for encapsulating the light emitting element layer EML.

The touch sensing unit TSU may be located on the encapsulation layer TFEL. The touch sensing unit TSU may include a plurality of touch electrodes for sensing a user's touch in a capacitive manner, and touch lines connecting the plurality of touch electrodes to the touch driver 400. For example, the touch sensing unit TSU may sense the user's touch by using a mutual capacitance method or a self-capacitance method.

For another example, the touch sensing unit TSU may be located on a separate substrate located on the display unit DU. In this case, the substrate supporting the touch sensing unit TSU may be a base member that encapsulates the display unit DU.

The plurality of touch electrodes of the touch sensing unit TSU may be located in a touch sensor area overlapping the display area DA. The touch lines of the touch sensing unit TSU may be located in a touch peripheral area that overlaps the non-display area NDA.

The color filter layer CFL may be located on the touch sensing unit TSU. The color filter layer CFL may include a plurality of color filters respectively corresponding to the plurality of emission areas. Each of the color filters may selectively transmit light of a specific wavelength and may block or absorb light of a different wavelength. The color filter layer CFL may absorb a part of light coming from the outside of the display device 10 to reduce reflected light due to external light. Accordingly, the color filter layer CFL may prevent or reduce color distortion caused by reflection of the external light.

Because the color filter layer CFL is directly located on the touch sensing unit TSU, the display device 10 may not require a separate substrate for the color filter layer CFL. Therefore, the thickness of the display device 10 may be relatively reduced.

The sub-region SBA of the display panel 100 may extend from one side of the main region MA. The sub-region SBA may include a flexible material which can be bent, folded or rolled. For example, when the sub-region SBA is bent, the sub-region SBA may overlap the main region MA in a thickness direction (Z-axis direction). The sub-region SBA may include the display driver 200 and the pad unit electrically connected to the circuit board 300.

Figure 3:
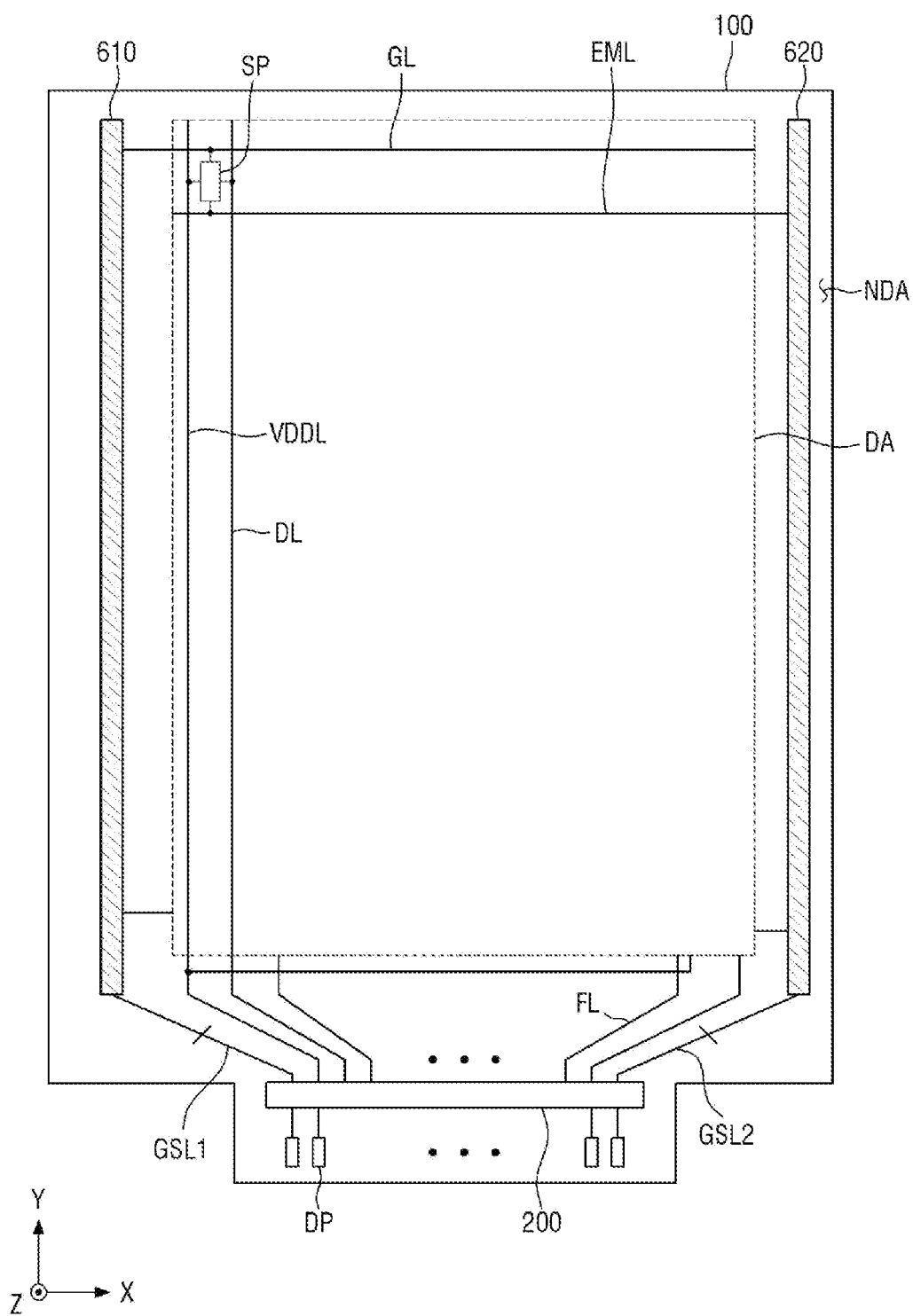
FIG. 3 is a plan view illustrating a display unit of a display device according to some embodiments.
Figure 4:
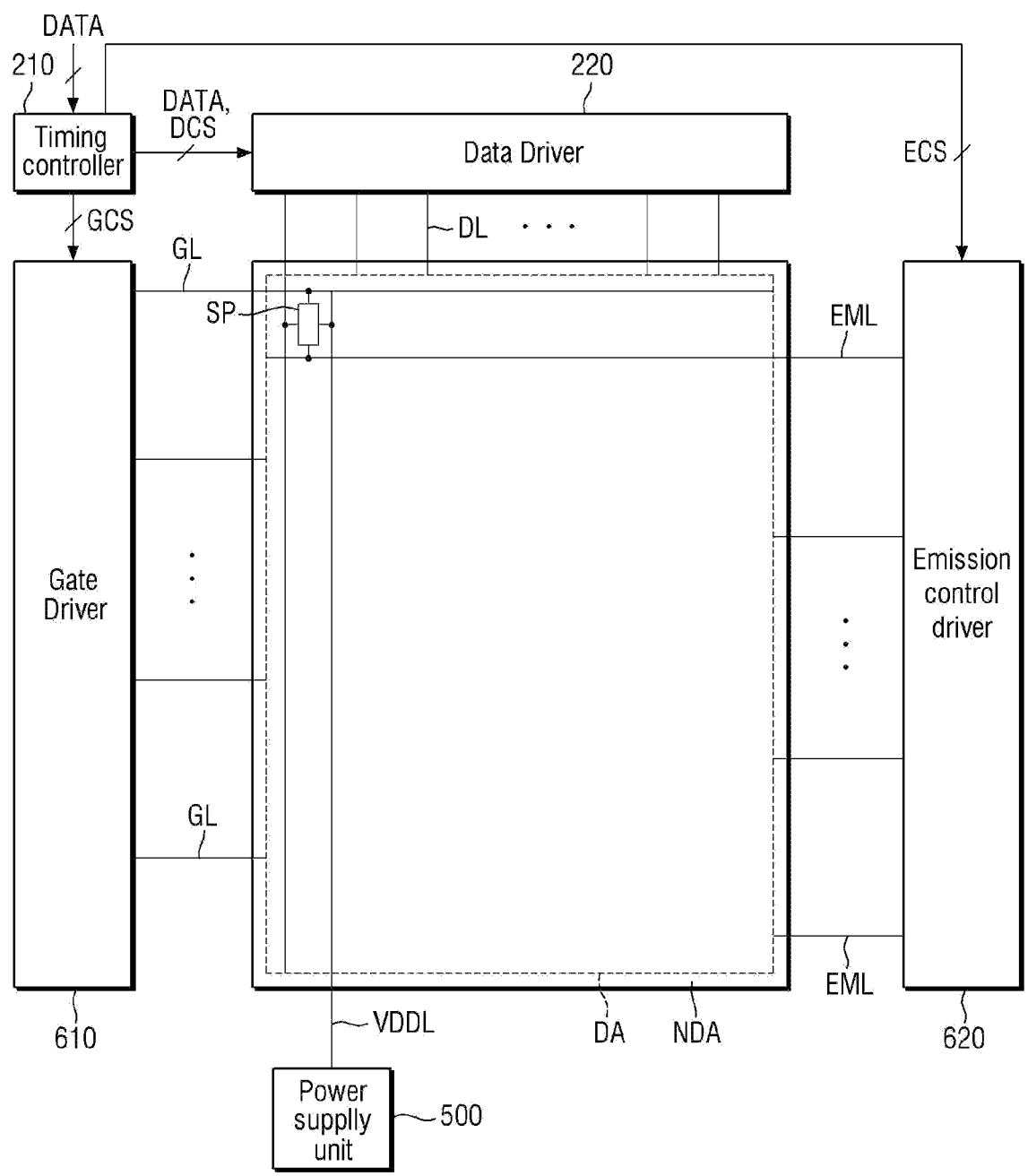
FIG. 4 is a block diagram illustrating a display panel and a display driver according to some embodiments.

FIG. 3 is a plan view illustrating a display unit of a display device according to some embodiments. FIG. 4 is a block diagram illustrating a display panel and a display driver according to some embodiments.

Referring to FIGS. 3 and 4, the display panel 100 may include the display area DA and the non-display area NDA.

The display area DA may include a plurality of pixels SP, and a plurality of driving voltage lines VDDL, a plurality of gate lines GL, a plurality of emission control lines EML, and a plurality of data lines DL that are connected to the plurality of pixels SP.

Each of the pixels SP may be connected to the gate line GL, the data line DL, the emission control line EML, and the driving voltage line VDDL. Each of the pixels SP may include at least one transistor, a light emitting element and a capacitor.

The gate lines GL may extend in the X-axis direction and may be spaced apart from each other in the Y-axis direction that crosses the X-axis direction. The gate lines GL may sequentially supply gate signals to the plurality of pixels SP.

The emission control lines EML may extend in the X-axis direction and may be spaced apart from each other in the Y-axis direction. The emission control lines EML may sequentially supply emission signals to the plurality of pixels SP.

The data lines DL may extend in the Y-axis direction and may be spaced apart from each other in the X-axis direction. The data lines DL may supply the data voltage to the plurality of pixels SP. The data voltage may determine the luminance of each of the pixels SP.

The driving voltage lines VDDL may extend in the Y-axis direction and may be spaced apart from each other in the X-axis direction. The driving voltage lines VDDL may supply a driving voltage to the plurality of pixels SP. The driving voltage may be a high potential voltage for driving the light emitting elements of the pixels SP.

The non-display area NDA may surround the display area DA. The non-display area NDA may include a gate driver 610, an emission control driver 620, fan-out lines FL, a first gate control line GSL1, and a second gate control line GSL2.

The fan-out lines FL may extend from the display driver 200 to the display area DA. The fan-out lines FL may supply the data voltage received from the display driver 200 to the plurality of data lines DL.

The first gate control line GSL1 may extend from the display driver 200 to the gate driver 610. The first gate control line GSL1 may supply a gate control signal GCS received from the display driver 200 to the gate driver 610.

The second gate control line GSL2 may extend from the display driver 200 to the emission control driver 620. The second gate control line GSL2 may supply an emission control signal ECS received from the display driver 200 to the emission control driver 620.

The sub-region SBA may extend from one side of the non-display area NDA. The sub-region SBA may include the display driver 200 and the pad portion DP. The pad portion DP may be located closer to one edge of the sub-region SBA than the display driver 200. The pad portion DP may be electrically connected to the circuit board 300 through an anisotropic conductive film ACF.

The display driver 200 may include a timing controller 210 and a data driver 220.

The timing controller 210 may receive digital video data DATA and timing signals from the circuit board 300. The timing controller 210 may generate, based on the timing signals, a data control signal DCS to control the operation timing of the data driver 220, the gate control signal GCS to control the operation timing of the gate driver 610, and the emission control signal ECS to control the operation timing of the emission control driver 620. The timing controller 210 may supply the gate control signal GCS to the gate driver 610 through the first gate control line GSL1. The timing controller 210 may supply the emission control signal ECS to the emission control driver 620 through the second gate control line GSL2. The timing controller 210 may supply the digital video data DATA and the data control signal DCS to the data driver 220.

The data driver 220 may convert the digital video data DATA into analog data voltages and supply them to the data lines DL through the fan-out lines FL. The gate signals of the gate driver 610 may select pixels SP to which the data voltage is supplied, and the selected pixels SP may receive the data voltage through the data lines DL.

The power supply unit 500 may be located on the circuit board 300 to supply a power voltage to the display driver 200 and the display panel 100. The power supply unit 500 may generate and supply a driving voltage to the driving voltage line VDDL, generate and supply an initialization voltage to the initialization voltage line, and generate and supply a common voltage to the common electrode common to the light emitting elements of the plurality of pixels.

The gate driver 610 may be located at one external side of the display area DA or at one side of the non-display area NDA. The emission control driver 620 may be located at the other external side of the display area DA or at the other side of the non-display area NDA. However, embodiments according to the present disclosure are not limited thereto.

As another example, the gate driver 610 and the emission control driver 620 may be located at any one of one side and the other side of the non-display area NDA.

The gate driver 610 may include a plurality of transistors for generating gate signals based on the gate control signal GCS. The emission control driver 620 may include a plurality of transistors for generating emission signals based on the emission control signal ECS. For example, the transistors of the gate driver 610 and the transistors of the emission control driver 620 may be formed on the same layer as the transistors of each pixel SP. The gate driver 610 may supply the gate signals to the gate lines GL, and the emission control driver 620 may supply the emission signals to the emission control lines EML.

Figure 5:
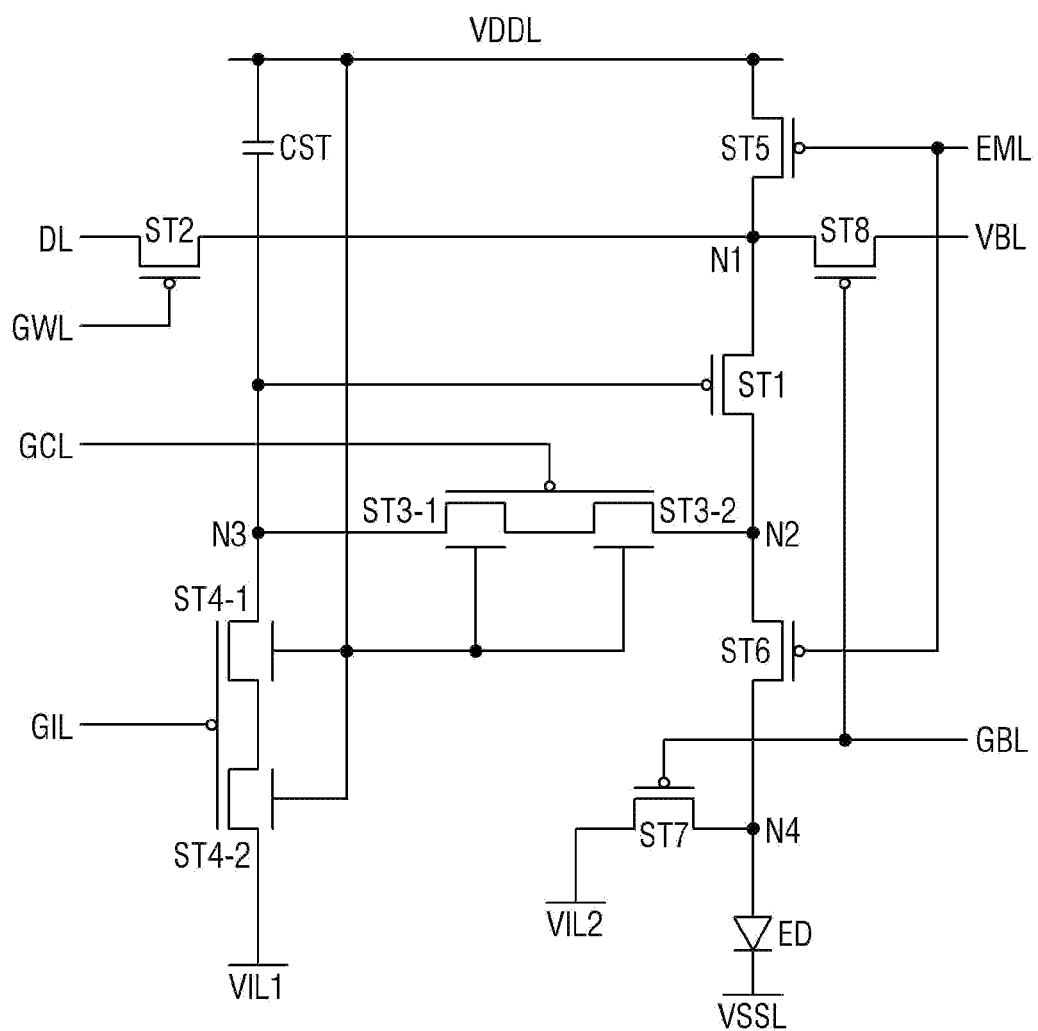
FIG. 5 is a circuit diagram illustrating a pixel of a display device according to some embodiments.
Figure 6:
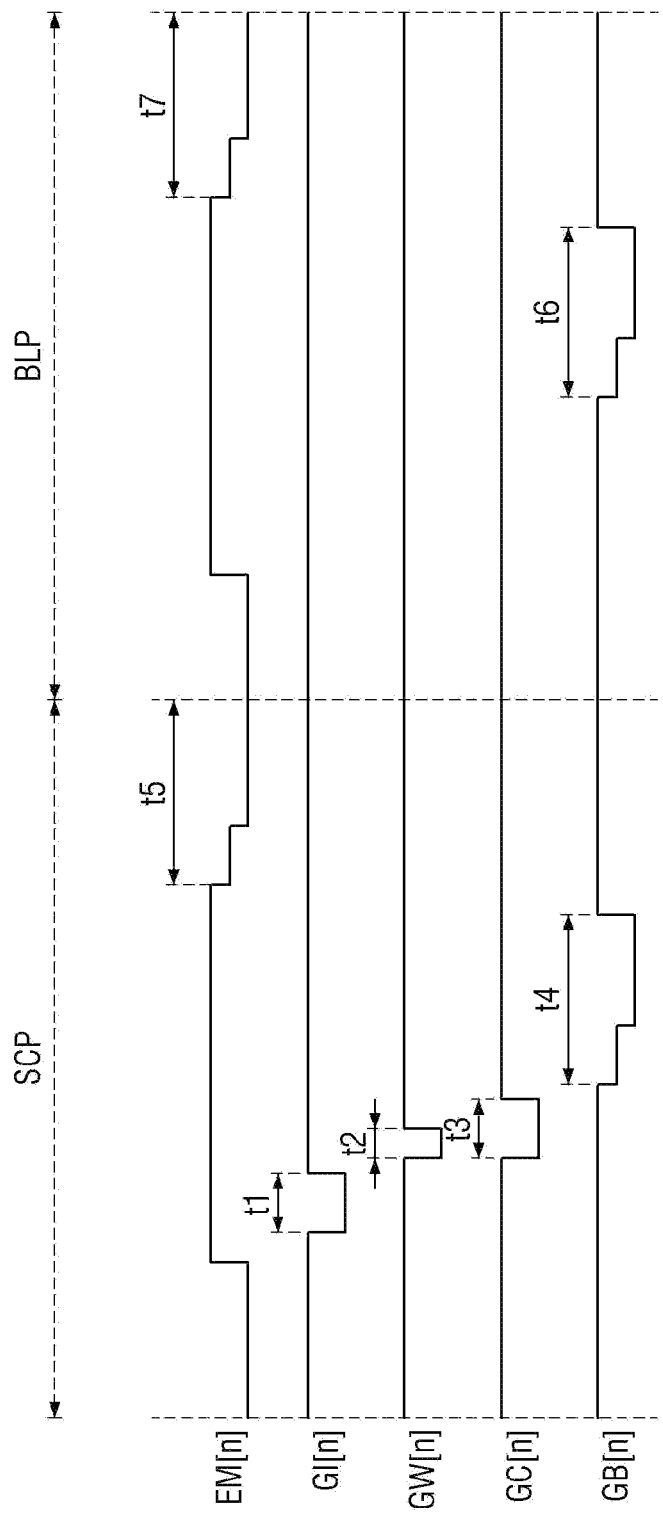
FIG. 6 is a waveform diagram of signals supplied to the pixel shown in FIG. 5.

FIG. 5 is a circuit diagram illustrating a pixel of a display device according to some embodiments. FIG. 6 is a waveform diagram of signals supplied to the pixel shown in FIG. 5.

Referring to FIGS. 5 and 6, the display panel 100 may include the plurality of pixels SP arranged along p rows (p is a natural number) and q columns (q is a natural number). Each of the pixels SP may be connected to a first gate line GWL, a second gate line GCL, a third gate line GIL, a fourth gate line GBL, the emission control line EML, the data line DL, the driving voltage line VDDL, a first initialization voltage line VIL1, a second initialization voltage line VIL2, and a bias voltage line VBL.

The pixel SP may include a pixel circuit and a light emitting element ED. The pixel circuit may include a first transistor ST1, a second transistor ST2, a third-first transistor ST3-1, a third-second transistor ST3-2, a fourth-first transistor ST4-1, a fourth-second transistor ST4-2, a fifth transistor ST5, a sixth transistor ST6, a seventh transistor ST7, an eighth transistor ST8, and a storage capacitor CST.

The first transistor ST1 may include a gate electrode, a source electrode, and a drain electrode. The first transistor ST1 may control a source-drain current Isd (hereinafter, referred to as "driving current") according to the data voltage applied to the gate electrode. The driving current Isd flowing through the channel of the first transistor ST1 may be proportional to the square of a difference between a threshold voltage Vth and a voltage Vsg between the source electrode and the gate electrode of the first transistor ST1 ($Isd = k \times (Vsg - Vth)^2$). Here, k is a proportional coefficient determined by the structure and physical characteristics of the first transistor ST1, Vsg is a source-gate voltage of the first transistor ST1, and Vth is a threshold voltage of the first transistor ST1.

The light emitting element ED may emit light by receiving the driving current Isd. The emission amount or the luminance of the light emitting element ED may be proportional to the magnitude of the driving current Isd.

The light emitting element ED may be an organic light emitting diode including a first electrode, a second electrode, and an organic light emitting layer located between the first electrode and the second electrode. For another example, the light emitting element ED may be an inorganic light emitting element including a first electrode, a second electrode, and an inorganic semiconductor located between the first electrode and the second electrode. For still another example, the light emitting element ED may be a quantum dot light emitting element including a first electrode, a second electrode, and a quantum dot light emitting layer located between the first electrode and the second electrode. For still another example, the light emitting element ED may be a micro light emitting diode.

The first electrode of the light emitting element ED may be electrically connected to a fourth node N4. The first electrode of the light emitting element ED may be connected to the drain electrode of the sixth transistor ST6 and the source electrode of the seventh transistor ST7 through the fourth node N4. The second electrode of the light emitting element ED may be connected to a low potential line VSSL. The second electrode of the light emitting element ED may receive a low potential voltage from the low potential line VSSL.

The second transistor ST2 may be turned on by a first gate signal GW[n] of the first gate line GWL to electrically connect the data line DL with a first node N1 that is the source electrode of the first transistor ST1. The second transistor ST2 may be turned on based on the first gate signal GW[n] to supply the data voltage to the first node N1. The gate electrode of the second transistor ST2 may be electrically connected to the first gate line GWL, the source electrode thereof may be electrically connected to the data line DL, and the drain electrode thereof may be electrically connected to the first node N1.

The third-first transistor ST3-1 and the third-second transistor ST3-2 may be turned on by a second gate signal GC[n] of the second gate line GCL to electrically connect a second node N2 that is the drain electrode of the first transistor ST1 with a third node N3 that is the gate electrode of the first transistor ST1. The third-first transistor ST3-1 and the third-second transistor ST3-2 may be connected in series between the second node N2 and the third node N3. The gate electrode of the third-first transistor ST3-1 may be electrically connected to the second gate line GCL, the source electrode thereof may be electrically connected to the third node N3, and the drain electrode thereof may be electrically connected to the source electrode of the third-second transistor ST3-2. The gate electrode of the third-second transistor ST3-2 may be electrically connected to the second gate line GCL, the source electrode thereof may be electrically connected to the drain electrode of the third-first transistor ST3-1, and the drain electrode thereof may be electrically connected to the second node N2. The gate electrode of the third-first transistor ST3-1 and the gate electrode of the third-second transistor ST3-2 may be integrally formed.

Each of the third-first transistor ST3-1 and the third-second transistor ST3-2 may include a bias electrode. The bias electrode of the third-first transistor ST3-1 may overlap the semiconductor region of the third-first transistor ST3-1, and the bias electrode of the third-second transistor ST3-2 may overlap the semiconductor region of the third-second transistor ST3-2. The bias electrodes of the third-first transistor ST3-1 and the third-second transistor ST3-2 may be electrically connected to the driving voltage line VDDL, and may receive the driving voltage from the driving voltage line VDDL. Therefore, the bias electrodes of the third-first transistor ST3-1 and the third-second transistor ST3-2 may stabilize the electric fields of the third-first transistor ST3-1 and the third-second transistor ST3-2 and improve output characteristics.

The third-first transistor ST3-1 and the third-second transistor ST3-2 may have excellent off current characteristics. Therefore, the third-first transistor ST3-1 and the third-second transistor ST3-2 may prevent or reduce instances of an off current flowing through the third node N3 that is the gate electrode of the first transistor ST1, and may stably maintain the voltage in the pixel SP. The off current characteristics of the third-first transistor ST3-1 and the third-second transistor ST3-2 will be described in detail with reference to FIG. 7.

The fourth-first transistor ST4-1 and the fourth-second transistor ST4-2 may be turned on by a third gate signal GI[n] of the third gate line GIL to electrically connect the third node N3 that is the gate electrode of the first transistor ST1 with the first initialization voltage line VIL1. The fourth-first transistor ST4-1 and the fourth-second transistor ST4-2 may be connected in series between the third node N3 and the first initialization voltage line VIL1. The gate electrode of the fourth-first transistor ST4-1 may be electrically connected to the third gate line GIL, the source electrode thereof may be electrically connected to the third node N3, and the drain electrode thereof may be electrically connected to the source electrode of the fourth-second transistor ST4-2. The gate electrode of the fourth-second transistor ST4-2 may be electrically connected to the third gate line GIL, the source electrode thereof may be electrically connected to the drain electrode of the fourth-first transistor ST4-1, and the drain electrode thereof may be electrically connected to the first initialization voltage line VIL1. The gate electrode of the fourth-first transistor ST4-1 and the gate electrode of the fourth-second transistor ST4-2 may be integrally formed.

Each of the fourth-first transistor ST4-1 and the fourth-second transistor ST4-2 may include a bias electrode. The bias electrode of the fourth-first transistor ST4-1 may overlap the semiconductor region of the fourth-first transistor ST4-1, and the bias electrode of the fourth-second transistor ST4-2 may overlap the semiconductor region of the fourth-second transistor ST4-2. The bias electrodes of the fourth-first transistor ST4-1 and fourth-second transistor ST4-2 may be electrically connected to the driving voltage line VDDL, and may receive the driving voltage from the driving voltage line VDDL. Therefore, the bias electrodes of the fourth-first transistor ST4-1 and fourth-second transistor ST4-2 may stabilize the electric fields of the fourth-first transistor ST4-1 and the fourth-second transistor ST4-2 and may improve output characteristics.

The fourth-first transistor ST4-1 and the fourth-second transistor ST4-2 may have excellent off current characteristics. Therefore, the fourth-first transistor ST4-1 and the fourth-second transistor ST4-2 may prevent or reduce instances of an off current flowing through the third node N3 that is the gate electrode of the first transistor ST1, and may stably maintain the voltage in the pixel SP. The off current characteristics of the fourth-first transistor ST4-1 and the fourth-second transistor ST4-2 will be described in detail with reference to FIG. 8.

The fifth transistor ST5 may be turned on by an emission signal EM[n] of the emission control line EML to electrically connect the driving voltage line VDDL with the first node N1 that is the source electrode of the first transistor ST1. The gate electrode of the fifth transistor ST5 may be electrically connected to the emission control line EML, the source electrode thereof may be electrically connected to the driving voltage line VDDL, and the drain electrode thereof may be electrically connected to the first node N1.

The sixth transistor ST6 may be turned on by the emission signal EM[n] of the emission control line EML to electrically connect the second node N2 that is the drain electrode of the first transistor ST1 with the fourth node N4 that is the first electrode of the light emitting element ED. The gate electrode of the sixth transistor ST6 may be electrically connected to the emission control line EML, the source electrode thereof may be electrically connected to the second node N2, and the drain electrode thereof may be electrically connected to the fourth node N4.

When all of the fifth transistor ST5, the first transistor ST1, and the sixth transistor ST6 are turned on, the driving current may be supplied to the light emitting element ED.

The seventh transistor ST7 may be turned on by a fourth gate signal GB[n] of the fourth gate line GBL to electrically connect the fourth node N4 that is the first electrode of the light emitting element ED with the second initialization voltage line VIL2. The seventh transistor ST7 may be turned based on the fourth gate signal GB[n], thereby discharging the first electrode of the light emitting element ED to a second initialization voltage. The gate electrode of the seventh transistor ST7 may be electrically connected to the fourth gate line GBL, the source electrode thereof may be electrically connected to the fourth node N4, and the drain electrode thereof may be electrically connected to the second initialization voltage line VIL2.

The eighth transistor ST8 may be turned on by the fourth gate signal GB[n] of the fourth gate line GBL to electrically connect the bias voltage line VBL with the first node N1 that is the source electrode of the first transistor ST1. The eighth transistor ST8 may be turned on based on the fourth gate signal GB[n], thereby supplying a bias voltage to the first node N1. The eighth transistor ST8 may improve hysteresis of the first transistor ST1 by supplying the bias voltage to the source electrode of the first transistor ST1. The gate electrode of the eighth transistor ST8 may be electrically connected to the fourth gate line GBL, the source electrode thereof may be electrically connected to the bias voltage line VBL, and the drain electrode thereof may be electrically connected to the first node N1.

Each of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, and the eighth transistor ST8 may include a silicon-based active layer. For example, each of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, and the eighth transistor ST8 may include an active layer made of low temperature polycrystalline silicon (LTPS). The active layer made of low temperature polycrystalline silicon may have high electron mobility and excellent turn-on characteristics. Accordingly, in the display device 10, because the transistors having excellent turn-on characteristics are included, it may be possible to relatively stably and relatively efficiently drive the plurality of pixels SP.

For example, each of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, and the eighth transistor ST8 may correspond to a p-type transistor. For example, each of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, and the eighth transistor ST8 may output the current flowing into the source electrode to the drain electrode based on the gate low voltage applied to the gate electrode.

For another example, at least one of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, or the eighth transistor ST8 may include an oxide-based active layer. The transistor including the oxide-based active layer may have a coplanar structure in which a gate electrode is located thereon. The transistor including the oxide-based active layer may correspond to an n-type transistor, and may output the current flowing into the drain electrode to the source electrode based on the gate high voltage applied to the gate electrode.

The storage capacitor CST may be electrically connected between the third node N3 that is the gate electrode of the first transistor ST1 and the driving voltage line VDDL. For example, the first capacitor electrode of the storage capacitor CST may be electrically connected to the third node N3, and the second capacitor electrode of the storage capacitor CST may be electrically connected to the driving voltage line VDDL, so that it may be possible to maintain the potential difference between the driving voltage line VDDL and the gate electrode of the first transistor ST1.

Referring to FIG. 6 in conjunction with FIG. 5, when the display device 10 is driven at a driving frequency (e.g., a set or predetermined driving frequency), one frame period may include at least one scanning period SCP and at least one blanking period BLP. The scanning period SCP may include first to fifth periods t1 to t5, and the blanking period BLP may include sixth and seventh periods t6 and t7.

The fourth-first transistor ST4-1 and the fourth-second transistor ST4-2 may receive the third gate signal GI[n] of a low level during the first period t1. The fourth-first transistor ST4-1 and the fourth-second transistor ST4-2 may be turned on based on the third gate signal GI[n] of a low level, and may discharge the third node N3 that is the gate electrode of the first transistor ST1 to a first initialization voltage. Accordingly, the fourth-first transistor ST4-1 and the fourth-second transistor ST4-2 may initialize the gate electrode of the first transistor ST1 during the first period t1.

The second transistor ST2 may receive the first gate signal GW[n] of a low level during the second period t2. The second transistor ST2 may be turned on based on the first gate signal GW[n] of a low level, and may supply a data voltage to the first node N1 that is the source electrode of the first transistor ST1.

The third-first transistor ST3-1 and the third-second transistor ST3-2 may receive the second gate signal GC[n] of a low level during the third period t3. The third-first transistor ST3-1 and the third-second transistor T3-2 may be turned on based on the second gate signal GC[n] of a low level, and may electrically connect the second node N2 and the third node N3.

The seventh transistor ST7 may receive the fourth gate signal GB[n] of a low level during the fourth period t4. The fourth gate signal GB[n] may fall in a stepwise manner during the fourth period t4. The seventh transistor ST7 may be turned on based on the fourth gate signal GB[n] of a low level, and may discharge the first electrode of the light emitting element ED to the second initialization voltage. Accordingly, the seventh transistor ST7 may initialize the first electrode of the light emitting element ED during the fourth period t4.

The eighth transistor ST8 may receive the fourth gate signal GB[n] of a low level during the fourth period t4. The eighth transistor ST8 may be turned on based on the fourth gate signal GB[n] of a low level to supply a bias voltage to the first node N1 that is the source electrode of the first transistor ST1. The eighth transistor ST8 may set an operating point or an operating condition of the first transistor ST1 during the fourth period t4. The eighth transistor ST8 may prevent or reduce changes in the characteristics of the first transistor ST1 due to bias stress and improve hysteresis.

When the source electrode of the first transistor ST1 receives the data voltage VDATA, a source-gate voltage Vsg of the first transistor ST1 may correspond to a difference voltage VDATA–VI1 between the data voltage VDATA and the first initialization voltage VI1, and the first transistor ST1 may be turned on because the source-gate voltage Vsg of the first transistor ST1 is greater than the threshold voltage (hereinafter, denoted by "Vth") (VDATA–VI1>=Vth). Accordingly, at the moment when the second transistor ST2 is turned on in the second period t2, the source-drain current Isd of the first transistor ST1 may be determined according to the data voltage VDATA, the first initialization voltage VI1, and the threshold voltage Vth of the first transistor ST1 (Isd=k×(VDATA–VI1–Vth)$^2$). The first transistor ST1 may supply the source-drain current Isd to the second node N2 until the source-gate voltage Vsg reaches the threshold voltage Vth of the first transistor ST1. Further, the third-first transistor ST3-1 and the third-second transistor ST3-2 may be turned on during the third period t3 to supply the voltage of the second node N2 to the third node N3. In this manner, while the first transistor ST1 is turned on, the voltage of the third node N3 and the source-drain current Isd of the first transistor ST1 may be changed, and the voltage of the third node N3 may eventually converge to a difference voltage Vdata-Vth between the data voltage VDATA and the threshold voltage Vth of the first transistor ST1.

The emission signal EM[n] may have a gate low voltage during the fifth period t5. The emission signal EM[n] may fall in a stepwise manner during the fifth period t5. When the emission signal EM[n] has a low level, the fifth and sixth transistors ST5 and ST6 may be turned on to supply a driving current to the light emitting element ED.

The fourth gate signal GB[n] may have a gate low voltage during the sixth period t6 of the blanking period BLP. Accordingly, the seventh transistor ST7 may initialize the fourth node N4 that is the first electrode of the light emitting element ED to the second initialization voltage even in the blanking period BLP. The eighth transistor ST8 may supply the bias voltage to the first node N1 that is the source electrode of the first transistor ST1 even in the blanking period BLP, thereby improving the hysteresis of the first transistor ST1.

The emission signal EM[n] may have a gate low voltage during the seventh period t7 of the blanking period BLP. Accordingly, when the emission signal EM[n] has a low level, the fifth and sixth transistors ST5 and ST6 may be turned on to supply a driving current to the initialized first electrode of the light emitting element ED.

Figure 7:
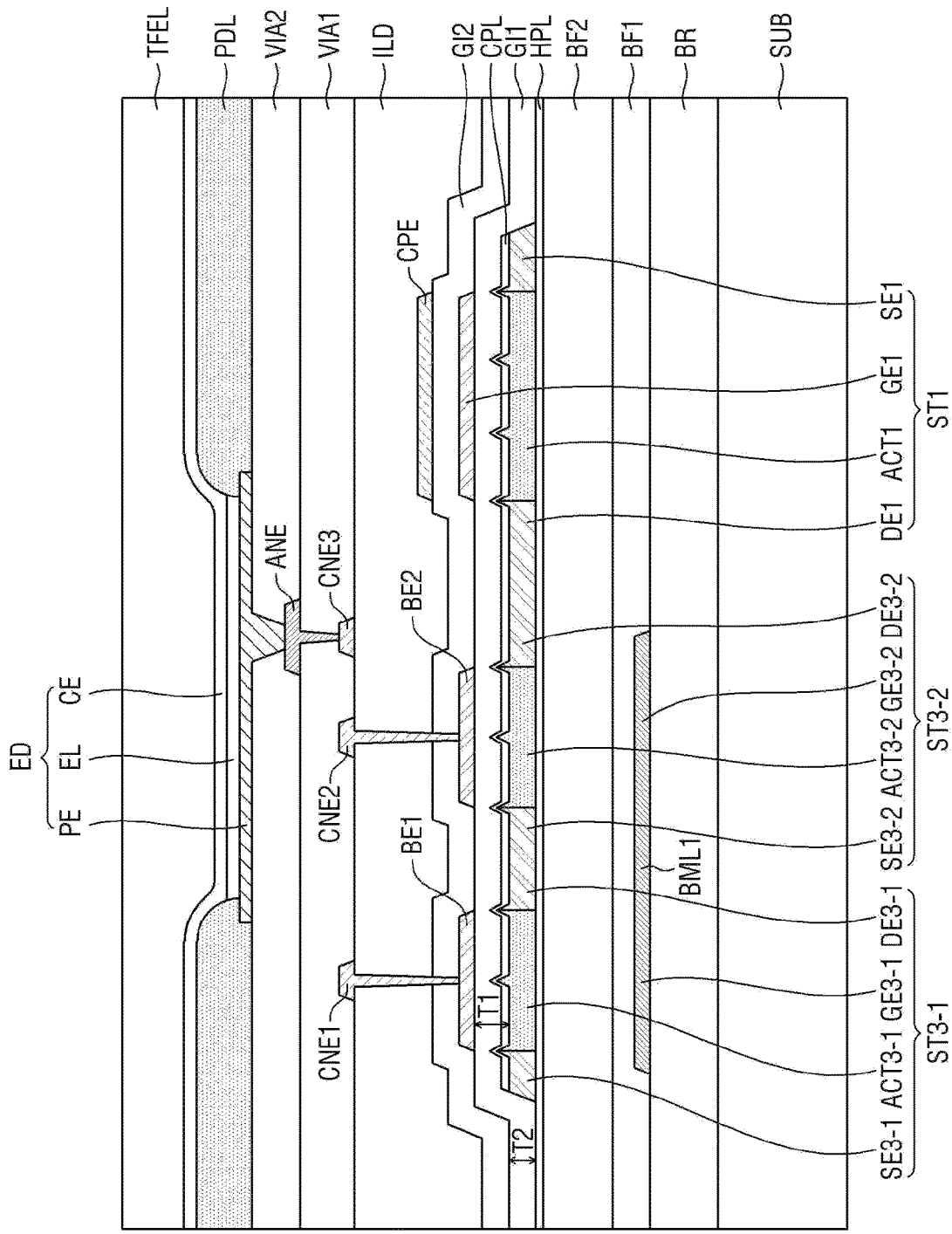
FIG. 7 is a cross-sectional view illustrating a part of a display device according to some embodiments.

FIG. 7 is a cross-sectional view illustrating a part of a display device according to some embodiments.

Referring to FIG. 7, the display panel 100 may include a substrate SUB, a barrier layer BR, a first metal layer BML1, a first buffer layer BF1, a second buffer layer BF2, a hydrogen passivation layer HPL, the first transistor ST1, the third-first transistor ST3-1, the third-second transistor ST3-2, a capping layer CPL, a first gate insulating layer GI1, a first bias electrode BE1, a second bias electrode BE2, a second gate insulating layer GI2, a capacitor electrode CPE, an interlayer insulating layer ILD, a first connection electrode CNE1, a second connection electrode CNE2, a third connection electrode CNE3, a first via layer VIA1, an anode connection electrode ANE, a second via layer VIA2, a pixel defining layer PDL, the light emitting element ED, and the encapsulation layer TFEL.

The substrate SUB may be a base substrate or a base member. The substrate SUB may be a flexible substrate which can be bent, folded or rolled. For example, the substrate SUB may include a glass material or a metal material, but is not limited thereto. For another example, the substrate SUB may include a polymer resin such as polyimide (PI).

The barrier layer BR may be located on the substrate SUB. The barrier layer BR may flatten the surface of the substrate SUB and protect the pixel circuit. The barrier layer BR may contain an inorganic insulating material capable of preventing or reducing infiltration of air, contaminants, or moisture. The barrier layer BR may include at least one of a silicon nitride layer, a silicon oxynitride layer, a silicon oxide layer, a titanium oxide layer, an aluminum oxide layer, or an amorphous silicon layer, but embodiments according to the present disclosure are not limited thereto.

The first metal layer BML1 may be located on the barrier layer BR. The first metal layer BML1 may overlap a semiconductor region ACT3-1 of the third-first transistor ST3-1 and a semiconductor region ACT3-2 of the third-second transistor ST3-2. A part of the first metal layer BML1 may be a gate electrode GE3-1 of the third-first transistor ST3-1, and another part of the first metal layer BML1 may be a gate electrode GE3-2 of the third-second transistor ST3-2. The first metal layer BML1 may be electrically connected to the second gate line GCL to receive the second gate signal GC[n]. The first metal layer BML1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The first buffer layer BF1 may be located on the first metal layer BML1 and the barrier layer BR. The first buffer layer BF1 may include an inorganic insulating material capable of preventing or reducing infiltration of air, contaminants, or moisture. The first buffer layer BF1 may include at least one of a silicon nitride layer, a silicon oxynitride layer, a silicon oxide layer, a titanium oxide layer, an aluminum oxide layer, or an amorphous silicon layer, but embodiments according to the present disclosure are not limited thereto.

The second buffer layer BF2 may be located on the first buffer layer BF1. The second buffer layer BF2 may include an inorganic insulating material capable of preventing or reducing infiltration of air, contaminants, or moisture. The second buffer layer BF2 may include at least one of a silicon nitride layer, a silicon oxynitride layer, a silicon oxide layer, a titanium oxide layer, an aluminum oxide layer, or an amorphous silicon layer, but embodiments according to the present disclosure are not limited thereto. For example, the first buffer layer BF1 may include a silicon nitride layer, and the second buffer layer BF2 may include a silicon oxide layer, but embodiments according to the present disclosure are not limited thereto.

The hydrogen passivation layer HPL may be located on the second buffer layer BF2. The hydrogen passivation layer HPL may have a thickness of about 50 angstroms (Å) or less, but is not limited thereto. The hydrogen passivation layer HPL may be in contact with the bottom surfaces of the semiconductor region ACT1 of the first transistor ST1, the semiconductor region ACT3-1 of the third-first transistor ST3-1, and the semiconductor region ACT3-2 of the third-second transistor ST3-2. Because no protrusion is formed on the bottom surfaces of the semiconductor region ACT1 of the first transistor ST1, the semiconductor region ACT3-1 of the third-first transistor ST3-1, and the semiconductor region ACT3-2 of the third-second transistor ST3-2, the hydrogen passivation layer HPL may have a flat surface.

The hydrogen passivation layer HPL may have a high hydrogen content. The hydrogen passivation layer HPL may include silicon oxide having a high hydrogen content. For example, the ratio ($N_2O/SiH_4$) of nitrogen dioxide ($N_2O$) to silane ($SiH_4$) of the hydrogen passivation layer HPL may be 10 to 40, but is not limited thereto. For another example, the hydrogen passivation layer HPL may be formed by hydrogen implantation (H-implantation) or hydrogen plasma treatment ($H_2$ plasma treatment). The hydrogen of the hydrogen passivation layer HPL may be bonded with silicon on the surfaces of the semiconductor region ACT3-1 of the third-first transistor ST3-1 and the semiconductor region ACT3-2 of the third-second transistor ST3-2, thereby reducing dangling bonds between the semiconductor region ACT3-1 of the third-first transistor ST3-1 and the semiconductor region ACT3-2 of the third-second transistor ST3-2. Therefore, the hydrogen passivation layer HPL may eliminate interface defects of the semiconductor region ACT3-1 of the third-first transistor ST3-1 and the semiconductor region ACT3-2 of the third-second transistor ST3-2 and improve off current characteristics and low frequency characteristics. In the display device 10, because the hydrogen passivation layer HPL is included, it may be possible to prevent or reduce instances of the off current flowing through the third-first transistor ST3-1 and the third-second transistor ST3-2, and also possible to stably maintain the voltage in the pixel SP.

The semiconductor region ACT1, the source electrode SE1, and the drain electrode DE1 of the first transistor ST1 may be located on the hydrogen passivation layer HPL. The semiconductor region ACT1 of the first transistor ST1 may overlap the gate electrode GE1 in the thickness direction, and may be insulated from the gate electrode GE1 by the capping layer CPL and the first gate insulating layer GI1. The source electrode SE1 and the drain electrode DE1 may be provided by making a material of the semiconductor region ACT1 conductive. The drain electrode DE1 of the first transistor ST1 may be electrically connected to the drain electrode DE3-2 of the third-second transistor ST3-2 through the second node N2 of FIG. 5.

The semiconductor region ACT3-1, the source electrode SE3-1, and the drain electrode DE3-1 of the third-first transistor ST3-1 may be located on the hydrogen passivation layer HPL. A part of the first metal layer BML1 may be the gate electrode GE3-1 of the third-first transistor ST3-1. The semiconductor region ACT3-1 of the third-first transistor ST3-1 may overlap the gate electrode GE3-1 in the thickness direction, and may be insulated from the gate electrode GE3-1 by the first buffer layer BF1 and the second buffer layer BF2. The source electrode SE3-1 and the drain electrode DE3-1 may be provided by making a material of the semiconductor region ACT3-1 conductive. The drain electrode DE3-1 of the third-first transistor ST3-1 may be integrally formed with the source electrode SE3-2 of the third-second transistor ST3-2. The drain electrode DE3-1 of the third-first transistor ST3-1 and the source electrode SE3-2 of the third-second transistor ST3-2 may overlap the first metal layer BML1, but embodiments according to the present disclosure are not limited thereto.

The semiconductor region ACT3-2, the source electrode SE3-2, and the drain electrode DE3-2 of the third-second transistor ST3-2 may be located on the hydrogen passivation layer HPL. Another part of the first metal layer BML1 may be the gate electrode GE3-2 of the third-second transistor ST3-2. The semiconductor region ACT3-2 of the third-second transistor ST3-2 may overlap the gate electrode GE3-2 in the thickness direction, and may be insulated from the gate electrode GE3-2 by the first buffer layer BF1 and the second buffer layer BF2. The source electrode SE3-2 and the drain electrode DE3-2 may be provided by making a material of the semiconductor region ACT3-2 conductive.

The capping layer CPL may be located on the semiconductor region ACT1, the source electrode SE1, and the drain electrode DE1 of the first transistor ST1, the semiconductor region ACT3-1, the source electrode SE3-1, and the drain electrode DE3-1 of the third-first transistor ST3-1, and the semiconductor region ACT3-2, the source electrode SE3-2, and the drain electrode DE3-2 of the third-second transistor ST3-2. In plan view, the capping layer CPL may have the same pattern as those of the semiconductor region ACT1, the source electrode SE1, and the drain electrode DE1 of the first transistor ST1, the semiconductor region ACT3-1, the source electrode SE3-1, and the drain electrode DE3-1 of the third-first transistor ST3-1, and the semiconductor region ACT3-2, the source electrode SE3-2, and the drain electrode DE3-2 of the third-second transistor ST3-2. The capping layer CPL may cover the protrusions formed on the semiconductor region ACT1, the source electrode SE1, and the drain electrode DE1 of the first transistor ST1. When the semiconductor region ACT1 of the first transistor ST1 includes low temperature polycrystalline silicon (LTPS), the amorphous silicon layer provided on the substrate SUB may be melted and crystallized by laser. In this case, grains may grow by crystallization of the amorphous silicon layer, and protrusions may be formed at grain boundaries between grains. The capping layer CPL covers the protrusions of the first transistor ST1 to prevent or reduce instances of an electric field being concentrated on the protrusions when the first transistor ST1 is driven, and may improve the driving range of the first transistor ST1. Accordingly, in the display device 10, because the capping layer CPL is included, it may be possible to precisely control the gray scale of light emitted from the light emitting element ED. The capping layer CPL may include at least one of a silicon nitride layer, a silicon oxynitride layer, a silicon oxide layer, a titanium oxide layer, an aluminum oxide layer, or an amorphous silicon layer, but embodiments according to the present disclosure are not limited thereto.

The first gate insulating layer GI1 may be located on the capping layer CPL and the hydrogen passivation layer HPL. The first gate insulating layer GI1 may insulate the gate electrode GE1 and the semiconductor region ACT1 of the first transistor ST1. The first gate insulating layer GI1 may include at least one of a silicon nitride layer, a silicon oxynitride layer, a silicon oxide layer, a titanium oxide layer, an aluminum oxide layer, or an amorphous silicon layer, but embodiments according to the present disclosure are not limited thereto. The first gate insulating layer GI1 may include the same material as that of the capping layer CPL, but embodiments according to the present disclosure are not limited thereto.

In the case of forming the first gate insulating layer GI1 by a deposition process, the thickness of the first gate insulating layer GI1 on the hydrogen passivation layer HPL and the thickness of the first gate insulating layer GI1 on the capping layer CPL may be substantially the same. A first thickness T1 may be larger than a second thickness T2. Here, the first thickness T1 may be the sum of the thickness of the capping layer CPL and the thickness of the first gate insulating layer GI1 overlapping each other, and the second thickness T2 may be the thickness of the first gate insulating layer GI1 that does not overlap the capping layer CPL. The thickness of the capping layer CPL may be determined by the difference between the first thickness T1 and the second thickness T2. The capping layer CPL may have a thickness of about 20 to about 200 angstroms (Å), and preferably about 100 angstroms (Å). Therefore, even when the first gate insulating layer GI1 and the capping layer CPL include the same material, the capping layer CPL may be located on the first transistor ST1, the third-first transistor ST3-1, and the third-second transistor ST3-2 to cover the protrusions of the first transistor ST1, the third-first transistor ST3-1, and the third-second transistor ST3-2.

The first bias electrode BE1, the second bias electrode BE2, and the gate electrode GE1 of the first transistor ST1 may be located on the first gate insulating layer GI1. The first bias electrode BE1, the second bias electrode BE2, and the gate electrode GE1 of the first transistor ST1 may be made of the same material on the same layer, but embodiments according to the present disclosure are not limited thereto.

The first bias electrode BE1 may be the bias electrode of the third-first transistor ST3-1. The first bias electrode BE1 may overlap the semiconductor region ACT3-1 of the third-first transistor ST3-1. The first bias electrode BE1 may be electrically connected to the driving voltage line VDDL, and may receive the driving voltage from the driving voltage line VDDL. Accordingly, the first bias electrode BE1 may stabilize the electric field of the third-first transistor ST3-1 and improve output characteristics.

The second bias electrode BE2 may be the bias electrode of the third-second transistor ST3-2. The second bias electrode BE2 may overlap the semiconductor region ACT3-2 of the third-second transistor ST3-2. The second bias electrode BE2 may be electrically connected to the driving voltage line VDDL, and may receive the driving voltage from the driving voltage line VDDL. Accordingly, the second bias electrode BE2 may stabilize the electric field of the third-second transistor ST3-2 and improve output characteristics.

The second gate insulating layer GI2 may be located on the first bias electrode BE1, the second bias electrode BE2, the gate electrode GE1 of the first transistor ST1, and the first gate insulating layer GI1. The second gate insulating layer GI2 may insulate the gate electrode GE1 of the first transistor ST1 and the capacitor electrode CPE. The second gate insulating layer GI2 may include a contact hole through which the first and second connection electrodes CNE1 and CNE2 pass. The second gate insulating layer GI2 may include at least one of a silicon nitride layer, a silicon oxynitride layer, a silicon oxide layer, a titanium oxide layer, an aluminum oxide layer, or an amorphous silicon layer, but embodiments according to the present disclosure are not limited thereto.

The capacitor electrode CPE may be located on the second gate insulating layer GI2 to overlap the gate electrode GE1 of the first transistor ST1. The gate electrode GE1 of the first transistor ST1 and the capacitor electrode CPE may form a capacitance. For example, the storage capacitor CST of FIG. 5 may be formed between the gate electrode GE1 of the first transistor ST1 and the capacitor electrode CPE. The gate electrode GE1 of the first transistor ST1 may be electrically connected as the first capacitor electrode of the storage capacitor CST to the third node N3, and the capacitor electrode CPE may be electrically connected as the second capacitor electrode of the storage capacitor CST to the driving voltage line VDDL.

The interlayer insulating layer ILD may be located on the capacitor electrode CPE and the second gate insulating layer GI2. The interlayer insulating layer ILD may include a contact hole through which the first and second connection electrodes CNE1 and CNE2 pass. The contact hole of the interlayer insulating layer ILD may be connected to the contact hole of the second gate insulating layer GI2.

The first connection electrode CNE1 may be located on the interlayer insulating layer ILD. The first connection electrode CNE1 may be inserted into the contact hole provided in the interlayer insulating layer ILD and the second gate insulating layer GI2 to be in contact with the first bias electrode BE1. The first connection electrode CNE1 may be electrically connected between the first bias electrode BE1 and the driving voltage line VDDL. Accordingly, the first connection electrode CNE1 may supply the driving voltage received from the driving voltage line VDDL to the first bias electrode BE1.

The second connection electrode CNE2 may be located to be spaced apart from the first connection electrode CNE1 on the interlayer insulating layer ILD. The second connection electrode CNE2 may be inserted into the contact hole provided in the interlayer insulating layer ILD and the second gate insulating layer GI2 to be in contact with the second bias electrode BE2. The second connection electrode CNE2 may be electrically connected between the second bias electrode BE2 and the driving voltage line VDDL. Accordingly, the second connection electrode CNE2 may supply the driving voltage received from the driving voltage line VDDL to the second bias electrode BE2.

The third connection electrode CNE3 may be located to be spaced apart from the first and second connection electrodes CNE1 and CNE2 on the interlayer insulating layer ILD. The third connection electrode CNE3 may electrically connect the pixel circuit of the pixel SP and the anode connection electrode ANE. For example, the third connection electrode CNE3 may be electrically connected to the fourth node N4 of FIG. 5. Accordingly, the third connection electrode CNE3 may supply the driving current received from the pixel circuit of the pixel SP to the light emitting element ED.

The first via layer VIA1 may be located on the first to third connection electrodes CNE1, CNE2, and CNE3 and the interlayer insulating layer ILD. For example, the first via layer VIA1 may include a contact hole through which the anode connection electrode ANE passes. For example, the first via layer VIA1 may include an organic insulating material such as polyimide (PI), but is not limited thereto.

The anode connection electrode ANE may be located on the first via layer VIA1. The anode connection electrode ANE may electrically connect the pixel electrode PE of the light emitting element ED and the third connection electrode CNE3. The anode connection electrode ANE may be inserted into the contact hole provided in the first via layer VIA1 to be in contact with the third connection electrode CNE3. Accordingly, the anode connection electrode ANE may supply the driving current received from the pixel circuit of the pixel SP to the light emitting element ED.

The second via layer VIA2 may be located on the anode connection electrode ANE and the second via layer VIA2. For example, the second via layer VIA2 may include a contact hole through which the pixel electrode PE passes. For example, the second via layer VIA2 may include an organic insulating material such as polyimide (PI), but is not limited thereto.

The pixel defining layer PDL may be located on the second via layer VIA2. The pixel defining layer PDL may define a plurality of emission areas or a plurality of opening areas. The pixel defining layer PDL may separate and insulate the pixel electrodes PE of the plurality of pixels SP.

The light emitting element ED may be located on the second via layer VIA2. The light emitting element ED of each of the plurality of pixels SP may include a pixel electrode PE, a light emitting layer EL, and a common electrode CE. The pixel electrode PE may be located on the second via layer VIA2. The pixel electrode PE may overlap one of the plurality of emission regions defined by the pixel defining layer PDL. The pixel electrode PE may receive a driving current from the pixel circuit of the pixel SP through the anode connection electrode ANE and the third connection electrode CNE3.

The light emitting layer EL may be located on the pixel electrode PE. For example, the light emitting layer EL may be an organic light emitting layer made of an organic material, but is not limited thereto. In the case where the light emitting layer EL is the organic light emitting layer, when the pixel circuit of the pixel SP applies a voltage (e.g., a set or predetermined voltage) to the pixel electrode PE, and the common electrode CE receives the common voltage or a cathode voltage, holes and electrons may move to the organic light emitting layer EL through a hole transporting layer and an electron transporting layer, respectively, and the holes and electrons may combine with each other in the organic light emitting layer EL to emit light.

The common electrode CE may be arranged on the light emitting layer EL. For example, the common electrode CE may not be divided for each of the pixels SP, but may be formed as an electrode body common to all pixels SP. The common electrode CE may be located on the light emitting layer EL in a plurality of emission areas, and may be located on the pixel defining layer PDL in an area except the emission areas.

The encapsulation layer TFEL may be located on the common electrode CE to cover the plurality of light emitting elements ED. The encapsulation layer TFEL may include at least one inorganic layer to prevent or reduce instances of oxygen, contaminants, or moisture permeating into the plurality of light emitting elements ED. The encapsulation layer TFEL may include at least one organic layer to protect the plurality of light emitting elements ED from foreign matters such as dust.

Figure 8:
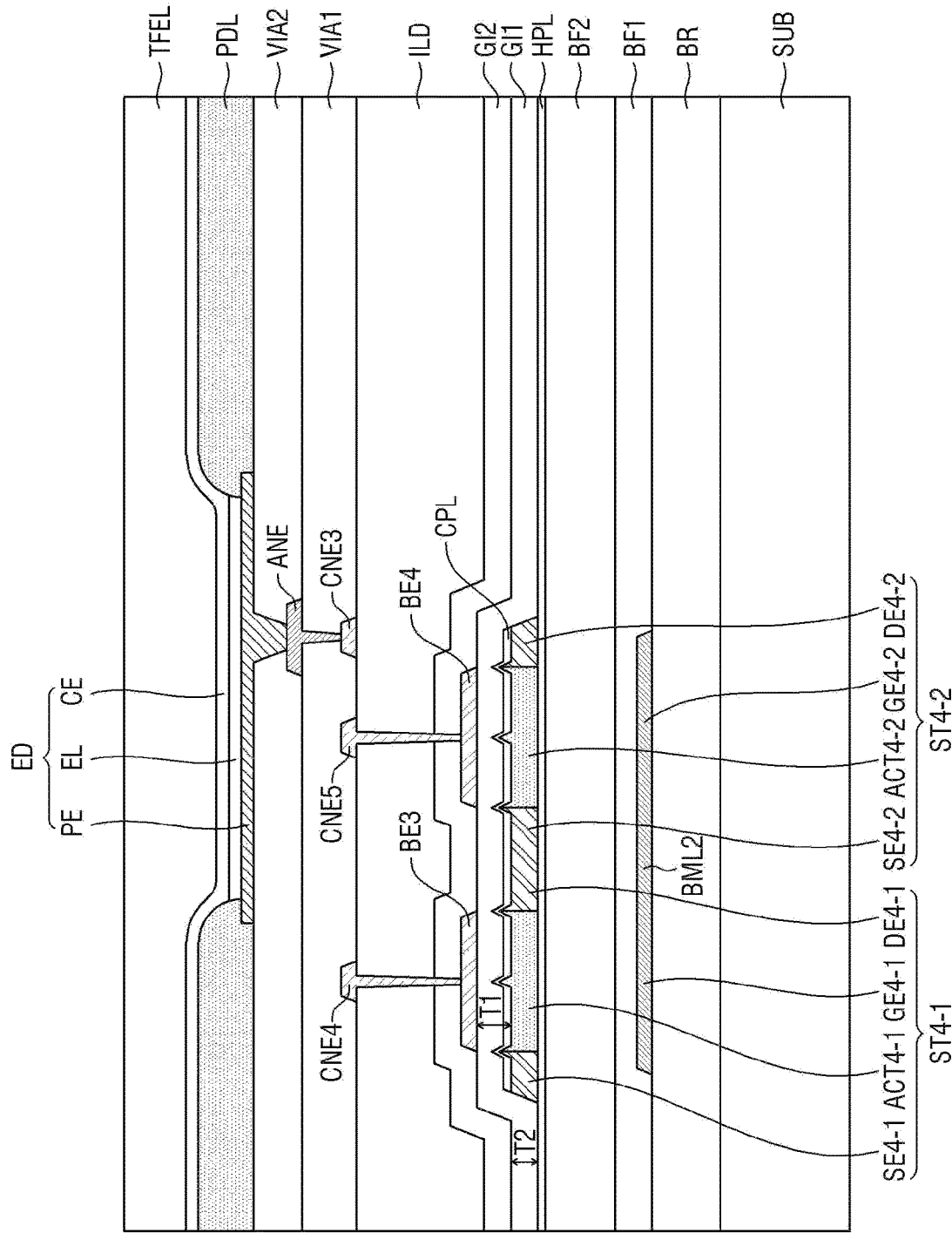
FIG. 8 is a cross-sectional view illustrating another part of a display device according to some embodiments.

FIG. 8 is a cross-sectional view illustrating another part of a display device according to some embodiments. Hereinafter, the same configurations as the above-described configurations will be briefly described, and some repetitive description thereof may be omitted.

Referring to FIG. 8, the display panel 100 may include the substrate SUB, the barrier layer BR, a second metal layer BML2, the first buffer layer BF1, the second buffer layer BF2, the hydrogen passivation layer HPL, the fourth-first transistor ST4-1, the fourth-second transistor ST4-2, the capping layer CPL, the first gate insulating layer GI1, a third bias electrode BE3, a fourth bias electrode BE4, the second gate insulating layer GI2, the interlayer insulating layer ILD, a fourth connection electrode CNE4, a fifth connection electrode CNE5, the third connection electrode CNE3, the first via layer VIA1, the anode connection electrode ANE, the second via layer VIA2, the pixel defining layer PDL, the light emitting element ED, and the encapsulation layer TFEL.

The second metal layer BML2 may be located on the barrier layer BR. The second metal layer BML2 may overlap a semiconductor region ACT4-1 of the fourth-first transistor ST4-1 and a semiconductor region ACT4-2 of the fourth-second transistor ST4-2. A part of the second metal layer BML2 may be a gate electrode GE4-1 of the fourth-first transistor ST4-1, and another part of the second metal layer BML2 may be a gate electrode GE4-2 of the fourth-second transistor ST4-2. The second metal layer BML2 may be electrically connected to the third gate line GIL to receive the third gate signal GI[n]. The second metal layer BML2 may be formed as a single layer or multiple layers including a conductive material such as at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The hydrogen passivation layer HPL may be located on the second buffer layer BF2. The hydrogen passivation layer HPL may have a thickness of about 50 angstroms (Å) or less, but is not limited thereto. The hydrogen passivation layer HPL may be in direct contact with the bottom surfaces of the semiconductor region ACT4-1 of the fourth-first transistor ST4-1 and the semiconductor region ACT4-2 of the fourth-second transistor ST4-2. Because no protrusion is formed on the bottom surfaces of the semiconductor region ACT4-1 of the fourth-first transistor ST4-1 and the semiconductor region ACT4-2 of the fourth-second transistor ST4-2, the hydrogen passivation layer HPL may have a flat surface.

The hydrogen passivation layer HPL may have a high hydrogen content. The hydrogen passivation layer HPL may include silicon oxide having a high hydrogen content. For example, the ratio ($N_2O/SiH_4$) of nitrogen dioxide ($N_2O$) to silane ($SiH_4$) of the hydrogen passivation layer HPL may be 10 to 40, but is not limited thereto. For another example, the hydrogen passivation layer HPL may be formed by hydrogen implantation (H-implantation) or hydrogen plasma treatment ($H_2$ plasma treatment).

Hydrogen of the hydrogen passivation layer HPL may be bonded with silicon on the surfaces of the semiconductor region ACT4-1 of the fourth-first transistor ST4-1 and the semiconductor region ACT4-2 of the fourth-second transistor ST4-2, thereby reducing dangling bonds between the semiconductor region ACT4-1 of the fourth-first transistor ST4-1 and the semiconductor region ACT4-2 of the fourth-second transistor ST4-2. Therefore, the hydrogen passivation layer HPL may eliminate interface defects of the semiconductor region ACT4-1 of the fourth-first transistor ST4-1 and the semiconductor region ACT4-2 of the fourth-second transistor ST4-2 and improve off current characteristics and low frequency characteristics. In the display device 10, because the hydrogen passivation layer HPL is included, it may be possible to prevent or reduce instances of an off current flowing through the fourth-first transistor ST4-1 and the fourth-second transistor ST4-2, and also possible to stably maintain the voltage in the pixel SP.

The semiconductor region ACT4-1, a source electrode SE4-1, and a drain electrode DE4-1 of the fourth-first transistor ST4-1 may be located on the hydrogen passivation layer HPL. A part of the second metal layer BML2 may be the gate electrode GE4-1 of the fourth-first transistor ST4-1. The semiconductor region ACT4-1 of the fourth-first transistor ST4-1 may overlap the gate electrode GE4-1 in the thickness direction, and may be insulated from the gate electrode GE4-1 by the first buffer layer BF1 and the second buffer layer BF2. The source electrode SE4-1 and the drain electrode DE4-1 may be provided by making a material of the semiconductor region ACT4-1 conductive. The drain electrode DE4-1 of the fourth-first transistor ST4-1 may be integrally formed with a source electrode SE4-2 of the fourth-second transistor ST4-2. The drain electrode DE4-1 of the fourth-first transistor ST4-1 and the source electrode SE4-2 of the fourth-second transistor ST4-2 may overlap the second metal layer BML2, but embodiments according to the present disclosure are not limited thereto.

The semiconductor region ACT4-2, the source electrode SE4-2, and a drain electrode DE4-2 of the fourth-second transistor ST4-2 may be located on the hydrogen passivation layer HPL. Another part of the second metal layer BML2 may be the gate electrode GE4-2 of the fourth-second transistor ST4-2. The semiconductor region ACT4-2 of the fourth-second transistor ST4-2 may overlap the gate electrode GE4-2 in the thickness direction, and may be insulated from the gate electrode GE4-2 by the first buffer layer BF1 and the second buffer layer BF2. The source electrode SE4-2 and the drain electrode DE4-2 may be provided by making a material of the semiconductor region ACT4-2 conductive.

The capping layer CPL may be located on the semiconductor region ACT4-1, the source electrode SE4-1, and the drain electrode DE4-1 of the fourth-first transistor ST4-1, and the semiconductor region ACT4-2, the source electrode SE4-2, and the drain electrode DE4-2 of the fourth-second transistor ST4-2. In plan view, the capping layer CPL may have the same pattern as those of the semiconductor region ACT4-1, the source electrode SE4-1, and the drain electrode DE4-1 of the fourth-first transistor ST4-1, and the semiconductor region ACT4-2, the source electrode SE4-2, and the drain electrode DE4-2 of the fourth-second transistor ST4-2. The capping layer CPL may include at least one of a silicon nitride layer, a silicon oxynitride layer, a silicon oxide layer, a titanium oxide layer, an aluminum oxide layer, or an amorphous silicon layer, but embodiments according to the present disclosure are not limited thereto.

In the case of forming the first gate insulating layer GI1 by a deposition process, the thickness of the first gate insulating layer GI1 on the hydrogen passivation layer HPL and the thickness of the first gate insulating layer GI1 on the capping layer CPL may be substantially the same. A first thickness T1 may be larger than a second thickness T2. Here, the first thickness T1 may be the sum of the thickness of the capping layer CPL and the thickness of the first gate insulating layer GI1 overlapping each other, and the second thickness T2 may be the thickness of the first gate insulating layer GI1 that does not overlap the capping layer CPL. The thickness of the capping layer CPL may be determined by the difference between the first thickness T1 and the second thickness T2. The capping layer CPL may have a thickness of about 20 to about 200 angstroms (Å), and preferably about 100 angstroms (Å). Therefore, even when the first gate insulating layer GI1 and the capping layer CPL include the same material, the capping layer CPL may be located on the fourth-first transistor ST4-1 and the fourth-second transistor ST4-2 to cover the protrusions of the fourth-first transistor ST4-1 and the fourth-second transistor ST4-2.

The third bias electrode BE3 and the fourth bias electrode BE4 may be located on the first gate insulating layer GI1. The first to fourth bias electrodes BE1, BE2, BE3, and BE4 and the gate electrode GE1 of the first transistor ST1 may be made of the same material on the same layer, but embodiments according to the present disclosure are not limited thereto.

The third bias electrode BE3 may be the bias electrode of the fourth-first transistor ST4-1. The third bias electrode BE3 may overlap the semiconductor region ACT4-1 of the fourth-first transistor ST4-1. The third bias electrode BE3 may be electrically connected to the driving voltage line VDDL, and may receive the driving voltage from the driving voltage line VDDL. Accordingly, the third bias electrode BE3 may stabilize the electric field of the fourth-first transistor ST4-1 and improve output characteristics.

The fourth bias electrode BE4 may be the bias electrode of the fourth-second transistor ST4-2. The fourth bias electrode BE4 may overlap the semiconductor region ACT4-2 of the fourth-second transistor ST4-2. The fourth bias electrode BE4 may be electrically connected to the driving voltage line VDDL, and may receive the driving voltage from the driving voltage line VDDL. Accordingly, the fourth bias electrode BE4 may stabilize the electric field of the fourth-second transistor ST4-2 and improve output characteristics.

The fourth connection electrode CNE4 may be located on the interlayer insulating layer ILD. The fourth connection electrode CNE4 may be inserted into the contact hole provided in the interlayer insulating layer ILD and the second gate insulating layer GI2 to be in contact with the third bias electrode BE3. The fourth connection electrode CNE4 may be electrically connected between the third bias electrode BE3 and the driving voltage line VDDL. Accordingly, the fourth connection electrode CNE4 may supply the driving voltage received from the driving voltage line VDDL to the third bias electrode BE3.

The fifth connection electrode CNE5 may be located to be spaced apart from the fourth connection electrode CNE4 on the interlayer insulating layer ILD. The fifth connection electrode CNE5 may be inserted into the contact hole provided in the interlayer insulating layer ILD and the second gate insulating layer GI2 to be in contact with the fourth bias electrode BE4. The fifth connection electrode CNE5 may be electrically connected between the fourth bias electrode BE4 and the driving voltage line VDDL. Accordingly, the fifth connection electrode CNE5 may supply the driving voltage received from the driving voltage line VDDL to the fourth bias electrode BE4.

Figure 9:
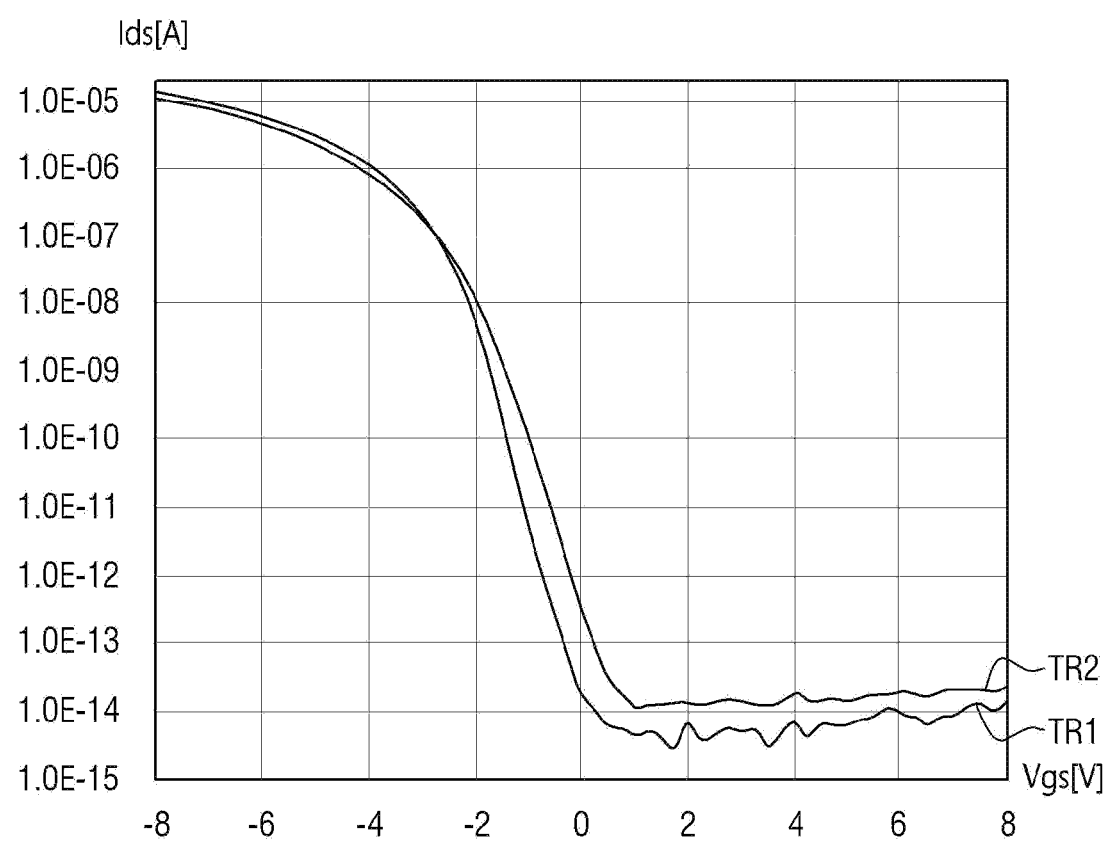
FIG. 9 is a graph illustrating transfer characteristics of first and second test transistors in a display device according to some embodiments.

FIG. 9 is a graph illustrating transfer characteristics of first and second test transistors in a display device according to some embodiments.

Referring to FIG. 9, a first test transistor TR1 may be the third-first transistor ST3-1, the third-second transistor ST3-2, the fourth-first transistor ST4-1, or the fourth-second transistor ST4-2 of the display device 10. A second test transistor TR2 may be a transistor that is not adjacent to the hydrogen passivation layer.

The bottom surface of the first test transistor TR1 may be in contact with the hydrogen passivation layer HPL. Because no protrusion is formed on the bottom surface of the first test transistor TR1, the hydrogen passivation layer HPL may have a flat surface. Hydrogen of the hydrogen passivation layer HPL may be bonded with silicon on the surface of the semiconductor region of the first test transistor TR1, thereby reducing the dangling bonds of the first test transistor TR1. Accordingly, the hydrogen passivation layer HPL may eliminate interface defects of the semiconductor region of the first test transistor TR1 and improve off current characteristics and low frequency characteristics. For example, the first and second test transistors TR1 and TR2 may correspond to p-type transistors, and may output the current flowing into the source electrode to the drain electrode based on the gate low voltage applied to the gate electrode. In a period in which a gate-source voltage Vgs of the p-type transistor has a positive value, a drain-source current Ids may correspond to an off current.

In a period in which the gate-source voltage Vgs has a positive value, the off current of the first test transistor TR1 may be smaller than the off current of the second test transistor TR2. Accordingly, in the display device 10, because the hydrogen passivation layer HPL is included, it may be possible to prevent or reduce instances of the off current flowing through the third-first transistor ST3-1, the third-second transistor ST3-2, the fourth-first transistor ST4-

1, and the fourth-second transistor ST4-2, and also possible to stably maintain the voltage in the pixel SP.

Figure 10:
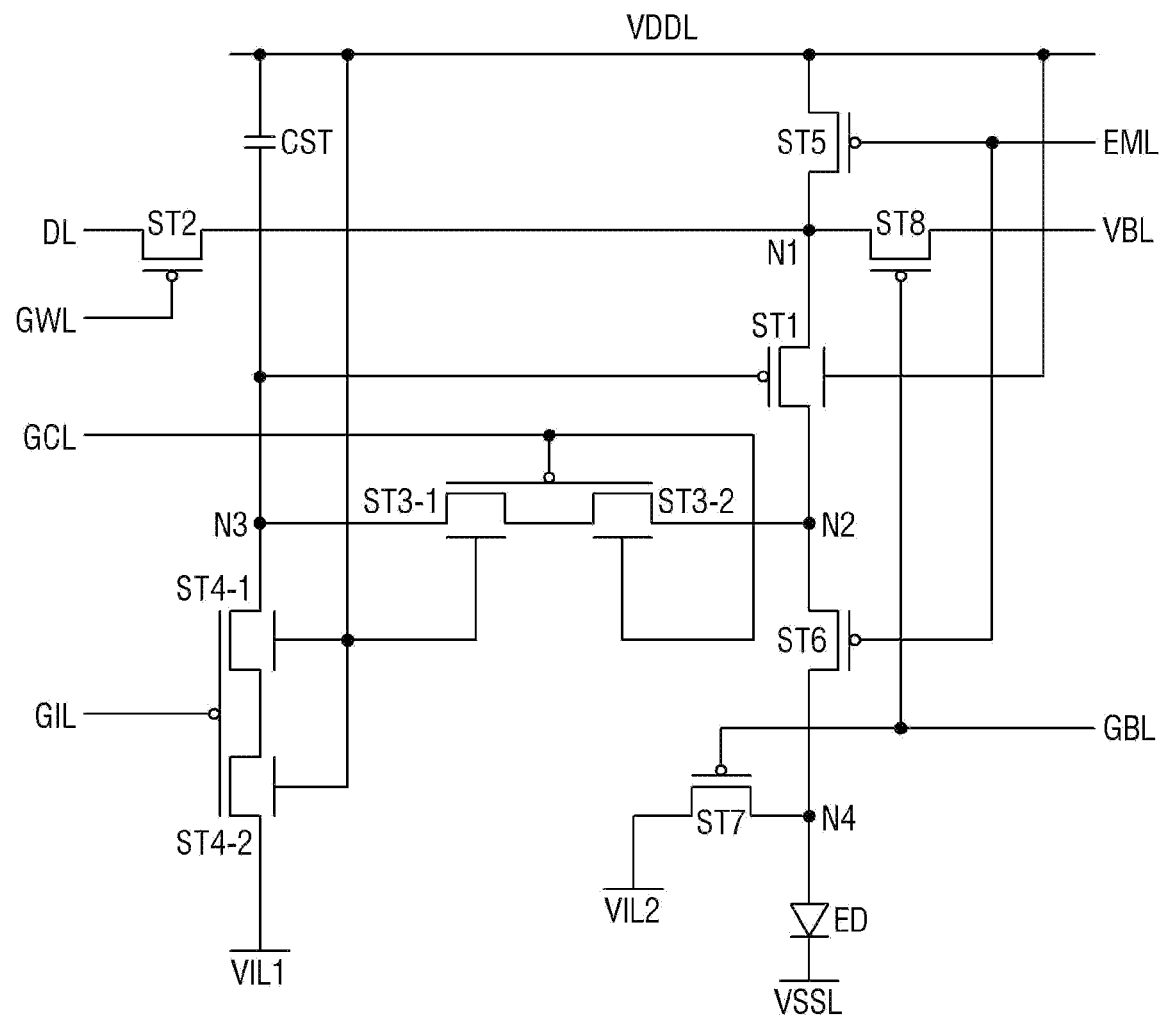
FIG. 10 is a circuit diagram showing a pixel of a display device according to some embodiments.

FIG. 10 is a circuit diagram showing a pixel of a display device according to some embodiments.

Referring to FIG. 10, the display panel 100 may include the plurality of pixels SP arranged along p rows (p is a natural number) and q columns (q is a natural number). Each of the pixels SP may be connected to a first gate line GWL, a second gate line GCL, a third gate line GIL, a fourth gate line GBL, the emission control line EML, the data line DL, the driving voltage line VDDL, a first initialization voltage line VIL1, a second initialization voltage line VIL2, and a bias voltage line VBL.

The pixel SP may include a pixel circuit and a light emitting element ED. The pixel circuit may include the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, the eighth transistor ST8, and the storage capacitor CST.

The first transistor ST1 may include a gate electrode, a source electrode, and a drain electrode. The first transistor ST1 may control a source-drain current Isd (hereinafter, referred to as "driving current") according to the data voltage applied to the gate electrode. The driving current Isd flowing through the channel of the first transistor ST1 may be proportional to the square of a difference between a threshold voltage Vth and a voltage Vsg between the source electrode and the gate electrode of the first transistor ST1 (Isd=k×(Vsg−Vth)$^2$). Here, k is a proportional coefficient determined by the structure and physical characteristics of the first transistor ST1, Vsg is a source-gate voltage of the first transistor ST1, and Vth is a threshold voltage of the first transistor ST1.

The first transistor ST1 may include a bias electrode. The bias electrode of the first transistor ST1 may overlap the semiconductor region of the first transistor ST1. The bias electrode of the first transistor ST1 may be electrically connected to the driving voltage line VDDL, and may receive the driving voltage from the driving voltage line VDDL. Accordingly, the bias electrode of the first transistor ST1 may stabilize the electric field of the first transistor ST1 and improve output characteristics.

The light emitting element ED may emit light by receiving the driving current Isd. The emission amount or the luminance of the light emitting element ED may be proportional to the magnitude of the driving current Isd.

The light emitting element ED may be an organic light emitting diode including a first electrode, a second electrode, and an organic light emitting layer located between the first electrode and the second electrode. For another example, the light emitting element ED may be an inorganic light emitting element including a first electrode, a second electrode, and an inorganic semiconductor located between the first electrode and the second electrode. For still another example, the light emitting element ED may be a quantum dot light emitting element including a first electrode, a second electrode, and a quantum dot light emitting layer located between the first electrode and the second electrode. For still another example, the light emitting element ED may be a micro light emitting diode.

The first electrode of the light emitting element ED may be electrically connected to a fourth node N4. The first electrode of the light emitting element ED may be connected to the drain electrode of the sixth transistor ST6 and the source electrode of the seventh transistor ST7 through the fourth node N4. The second electrode of the light emitting element ED may be connected to a low potential line VSSL. The second electrode of the light emitting element ED may receive the low potential voltage from the low potential line VSSL.

The second transistor ST2 may be turned on by a first gate signal GW[n] of the first gate line GWL to electrically connect the data line DL with a first node N1 that is the source electrode of the first transistor ST1. The second transistor ST2 may be turned on based on the first gate signal GW[n] to supply the data voltage to the first node N1. The gate electrode of the second transistor ST2 may be electrically connected to the first gate line GWL, the source electrode thereof may be electrically connected to the data line DL, and the drain electrode thereof may be electrically connected to the first node N1.

The third-first transistor ST3-1 and the third-second transistor ST3-2 may be turned on by a second gate signal GC[n] of the second gate line GCL to electrically connect a second node N2 that is the drain electrode of the first transistor ST1 with a third node N3 that is the gate electrode of the first transistor ST1. The gate electrode of the third-first transistor ST3-1 may be electrically connected to the second gate line GCL, the source electrode thereof may be electrically connected to the third node N3, and the drain electrode thereof may be electrically connected to the source electrode of the third-second transistor ST3-2. The gate electrode of the third-second transistor ST3-2 may be electrically connected to the second gate line GCL, the source electrode thereof may be electrically connected to the drain electrode of the third-first transistor ST3-1, and the drain electrode thereof may be electrically connected to the second node N2. The gate electrode of the third-first transistor ST3-1 and the gate electrode of the third-second transistor ST3-2 may be integrally formed.

The third-first transistor ST3-1 may include a bias electrode. The bias electrode of the third-first transistor ST3-1 may overlap the semiconductor region of the third-first transistor ST3-1. The bias electrode of the third-first transistor ST3-1 may be electrically connected to the driving voltage line VDDL. and may receive the driving voltage from the driving voltage line VDDL. The bias electrode of the third-first transistor ST3-1 may provide high potential characteristics to improve output characteristics of the third-first transistor ST3-1. Accordingly, the bias electrode of the third-first transistor ST3-1 may stabilize the electric field of the third-first transistor ST3-1 and improve output characteristics.

The third-second transistor ST3-2 may include a bias electrode. The bias electrode of the third-second transistor ST3-2 may overlap the semiconductor region of the third-second transistor ST3-2. The bias electrode of the third-second transistor ST3-2 may be electrically connected to the gate electrode of the third-second transistor ST3-2, and may receive the second gate signal GC[n]) from the second gate line GCL. The bias electrode of the third-second transistor ST3-2 may increase the electric field caused by the second gate signal GC[n] to improve the output characteristics of the third-second transistor ST3-2. Accordingly, the bias electrode of the third-second transistor ST3-2 may stabilize the electric field of the third-second transistor ST3-2 and improve output characteristics.

The third-first transistor ST3-1 and the third-second transistor ST3-2 may have excellent off current characteristics. Therefore, the third-first transistor ST3-1 and the third-second transistor ST3-2 may prevent or reduce instances of an off current flowing through the third node N3 that is the gate electrode of the first transistor ST1, and may stably maintain the voltage in the pixel SP. The off current characteristics of the third-first transistor ST3-1 and the third-second transistor ST3-2 will be described in detail with reference to FIG. 11.

The fourth-first transistor ST4-1 and the fourth-second transistor ST4-2 may be turned on by a third gate signal GI[n] of the third gate line GIL to electrically connect the third node N3 that is the gate electrode of the first transistor ST1 with the first initialization voltage line VIL1. The gate electrode of the fourth-first transistor ST4-1 may be electrically connected to the third gate line GIL, the source electrode thereof may be electrically connected to the third node N3, and the drain electrode thereof may be electrically connected to the source electrode of the fourth-second transistor ST4-2. The gate electrode of the fourth-second transistor ST4-2 may be electrically connected to the third gate line GIL, the source electrode thereof may be electrically connected to the drain electrode of the fourth-first transistor ST4-1, and the drain electrode thereof may be electrically connected to the first initialization voltage line VIL1. The gate electrode of the fourth-first transistor ST4-1 and the gate electrode of the fourth-second transistor ST4-2 may be integrally formed.

Each of the fourth-first transistor ST4-1 and the fourth-second transistor ST4-2 may include a bias electrode. The bias electrode of the fourth-first transistor ST4-1 may overlap the semiconductor region of the fourth-first transistor ST4-1, and the bias electrode of the fourth-second transistor ST4-2 may overlap the semiconductor region of the fourth-second transistor ST4-2. The bias electrodes of the fourth-first transistor ST4-1 and fourth-second transistor ST4-2 may be electrically connected to the driving voltage line VDDL, and may receive the driving voltage from the driving voltage line VDDL. Therefore, the bias electrodes of the fourth-first transistor ST4-1 and fourth-second transistor ST4-2 may stabilize the electric fields of the fourth-first transistor ST4-1 and the fourth-second transistor ST4-2 and may improve output characteristics.

The fourth-first transistor ST4-1 and the fourth-second transistor ST4-2 may have excellent off current characteristics. Therefore, the fourth-first transistor ST4-1 and the fourth-second transistor ST4-2 may prevent or reduce instances of an off current flowing through the third node N3 that is the gate electrode of the first transistor ST1, and may stably maintain the voltage in the pixel SP.

The fifth transistor ST5 may be turned on by an emission signal EM[n] of the emission control line EML to electrically connect the driving voltage line VDDL with the first node N1 that is the source electrode of the first transistor ST1. The gate electrode of the fifth transistor ST5 may be electrically connected to the emission control line EML, the source electrode thereof may be electrically connected to the driving voltage line VDDL, and the drain electrode thereof may be electrically connected to the first node N1.

The sixth transistor ST6 may be turned on by the emission signal EM[n] of the emission control line EML to electrically connect the second node N2 that is the drain electrode of the first transistor ST1 with the fourth node N4 that is the first electrode of the light emitting element ED. The gate electrode of the sixth transistor ST6 may be electrically connected to the emission control line EML, the source electrode thereof may be electrically connected to the second node N2, and the drain electrode thereof may be electrically connected to the fourth node N4.

When all of the fifth transistor ST5, the first transistor ST1, and the sixth transistor ST6 are turned on, the driving current may be supplied to the light emitting element ED.

The seventh transistor ST7 may be turned on by a fourth gate signal GB[n] of the fourth gate line GBL to electrically connect the fourth node N4 that is the first electrode of the light emitting element ED with the second initialization voltage line VIL2. The seventh transistor ST7 may be turned based on the fourth gate signal GB[n], thereby discharging the first electrode of the light emitting element ED to a second initialization voltage. The gate electrode of the seventh transistor ST7 may be electrically connected to the fourth gate line GBL, the source electrode thereof may be electrically connected to the fourth node N4, and the drain electrode thereof may be electrically connected to the second initialization voltage line VIL2.

The eighth transistor ST8 may be turned on by the fourth gate signal GB[n] of the fourth gate line GBL to electrically connect the bias voltage line VBL with the first node N1 that is the source electrode of the first transistor ST1. The eighth transistor ST8 may be turned on based on the fourth gate signal GB[n], thereby supplying a bias voltage to the first node N1. The eighth transistor ST8 may improve hysteresis of the first transistor ST1 by supplying the bias voltage to the source electrode of the first transistor ST1. The gate electrode of the eighth transistor ST8 may be electrically connected to the fourth gate line GBL, the source electrode thereof may be electrically connected to the bias voltage line VBL, and the drain electrode thereof may be electrically connected to the first node N1.

Each of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, and the eighth transistor ST8 may include a silicon-based active layer. For example, each of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, and the eighth transistor ST8 may include an active layer made of low temperature polycrystalline silicon (LTPS). The active layer made of low temperature polycrystalline silicon may have high electron mobility and excellent turn-on characteristics. Accordingly, in the display device 10, because the transistors having excellent turn-on characteristics are included, it may be possible to stably and efficiently drive the plurality of pixels SP.

For example, each of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, and the eighth transistor ST8 may correspond to a p-type transistor. For example, each of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, and the eighth transistor ST8 may output the current flowing into the source electrode to the drain electrode based on the gate low voltage applied to the gate electrode.

For another example, at least one of the first transistor ST1, the second transistor ST2, the third-first transistor ST3-1, the third-second transistor ST3-2, the fourth-first transistor ST4-1, the fourth-second transistor ST4-2, the fifth transistor ST5, the sixth transistor ST6, the seventh transistor ST7, or the eighth transistor ST8 may include an oxide-based active layer. The transistor including the oxide-based active layer may have a coplanar structure in which a gate electrode is located thereon. The transistor including the oxide-based active layer may correspond to an n-type transistor, and may output the current flowing into the drain electrode to the source electrode based on the gate high voltage applied to the gate electrode.

The storage capacitor CST may be electrically connected between the third node N3 that is the gate electrode of the first transistor ST1 and the driving voltage line VDDL. For example, the first capacitor electrode of the storage capacitor CST may be electrically connected to the third node N3, and the second capacitor electrode of the storage capacitor CST may be electrically connected to the driving voltage line VDDL, so that it may be possible to maintain the potential difference between the driving voltage line VDDL and the gate electrode of the first transistor ST1.

Figure 11:
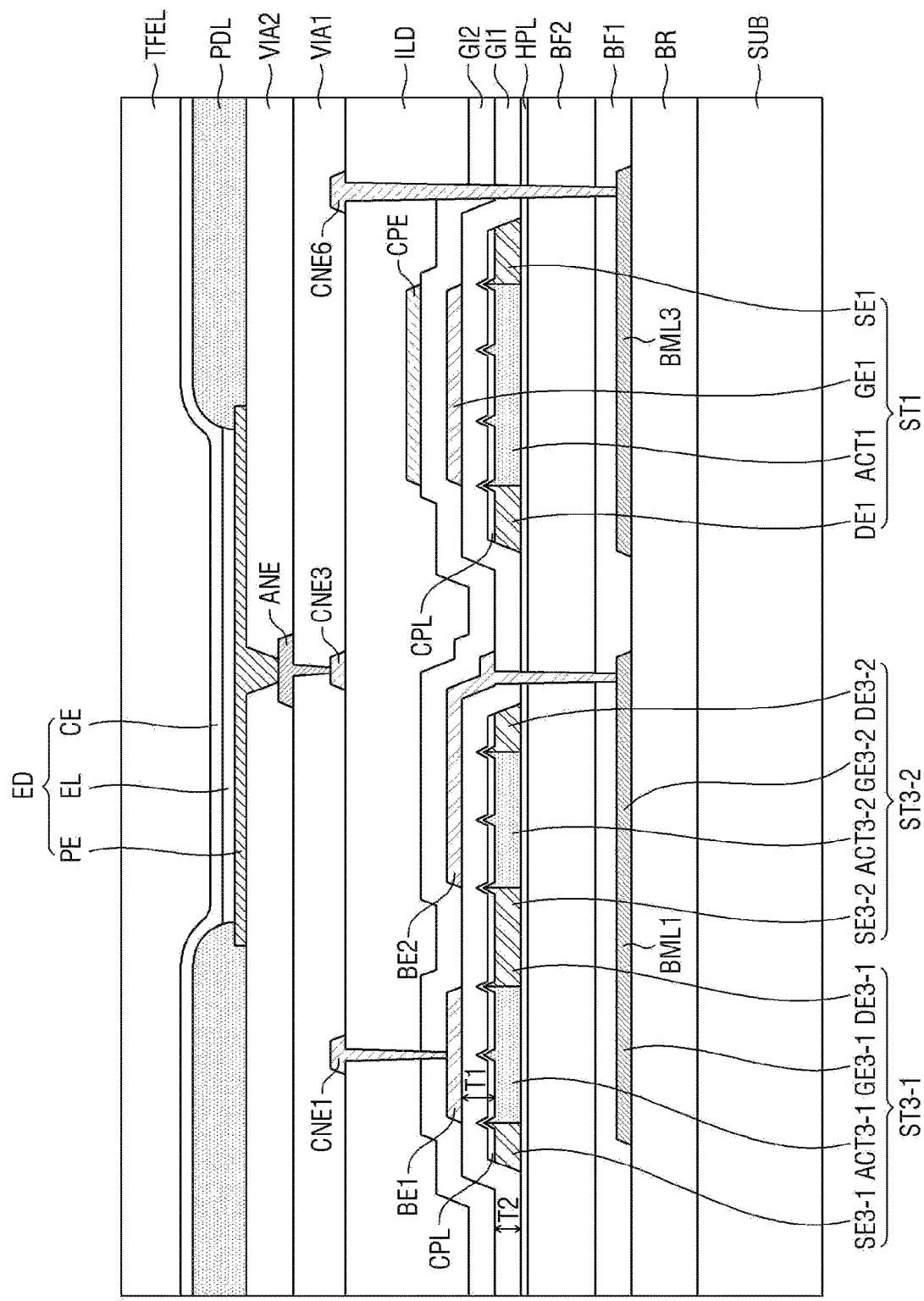
FIG. 11 is a cross-sectional view illustrating a portion of a display device according to some embodiments.

FIG. 11 is a cross-sectional view illustrating a portion of a display device according to some embodiments. Hereinafter, the same configurations as the above-described configurations will be briefly described, and some repetitive description thereof may be omitted.

Referring to FIG. 11, the display panel 100 may include the substrate SUB, the barrier layer BR, the first metal layer BML1, a third metal layer BML3, the first buffer layer BF1, the second buffer layer BF2, the hydrogen passivation layer HPL, the first transistor ST1, the third-first transistor ST3-1, the third-second transistor ST3-2, the capping layer CPL, the first gate insulating layer GI1, the first bias electrode BE1, the second bias electrode BE2, the second gate insulating layer GI2, the capacitor electrode CPE, the interlayer insulating layer ILD, the first connection electrode CNE1, the third connection electrode CNE3, a sixth connection electrode CNE6, the first via layer VIA1, the anode connection electrode ANE, the second via layer VIA2, the pixel defining layer PDL, the light emitting element ED, and the encapsulation layer TFEL.

The first metal layer BML1 may be located on the barrier layer BR. The first metal layer BML1 may overlap a semiconductor region ACT3-1 of the third-first transistor ST3-1 and a semiconductor region ACT3-2 of the third-second transistor ST3-2. A part of the first metal layer BML1 may be a gate electrode GE3-1 of the third-first transistor ST3-1, and another part of the first metal layer BML1 may be a gate electrode GE3-2 of the third-second transistor ST3-2. The first metal layer BML1 may be electrically connected to the second gate line GCL to receive the second gate signal GC[n].

The third metal layer BML3 may be located to be spaced apart from the first metal layer BML1 on the barrier layer BR. The third metal layer BML3 may overlap the semiconductor region ACT1 of the first transistor ST1. The third metal layer BML3 may be the bias electrode of the first transistor ST1. The third metal layer BML3 may be electrically connected to the driving voltage line VDDL through the sixth connection electrode CNE6, and may receive the driving voltage from the driving voltage line VDDL. Accordingly, the third metal layer BML3 may stabilize the electric field of the first transistor ST1 and improve output characteristics.

The hydrogen passivation layer HPL may be located on the second buffer layer BF2. The hydrogen passivation layer HPL may have a thickness of about 50 angstroms (Å) or less, but is not limited thereto. The hydrogen passivation layer HPL may be in contact with the bottom surfaces of the semiconductor region ACT1 of the first transistor ST1, the semiconductor region ACT3-1 of the third-first transistor ST3-1, and the semiconductor region ACT3-2 of the third-second transistor ST3-2. Because no protrusion is formed on the bottom surfaces of the semiconductor region ACT1 of the first transistor ST1, the semiconductor region ACT3-1 of the third-first transistor ST3-1, and the semiconductor region ACT3-2 of the third-second transistor ST3-2, the hydrogen passivation layer HPL may have a flat surface.

The hydrogen passivation layer HPL may have a high hydrogen content. The hydrogen passivation layer HPL may include silicon oxide having a high hydrogen content. For example, the ratio ($N_2O/SiH_4$) of nitrogen dioxide ($N_2O$) to silane ($SiH_4$) of the hydrogen passivation layer HPL may be 10 to 40, but is not limited thereto. For another example, the hydrogen passivation layer HPL may be formed by hydrogen implantation (H-implantation) or hydrogen plasma treatment ($H_2$ plasma treatment).

The hydrogen of the hydrogen passivation layer HPL may be bonded with silicon on the surfaces of the semiconductor region ACT3-1 of the third-first transistor ST3-1 and the semiconductor region ACT3-2 of the third-second transistor ST3-2, thereby reducing dangling bonds between the semiconductor region ACT3-1 of the third-first transistor ST3-1 and the semiconductor region ACT3-2 of the third-second transistor ST3-2. Therefore, the hydrogen passivation layer HPL may eliminate interface defects of the semiconductor region ACT3-1 of the third-first transistor ST3-1 and the semiconductor region ACT3-2 of the third-second transistor ST3-2 and improve off current characteristics and low frequency characteristics. In the display device 10, because the hydrogen passivation layer HPL is included, it may be possible to prevent or reduce instances of the off current flowing through the third-first transistor ST3-1 and the third-second transistor ST3-2, and also possible to stably maintain the voltage in the pixel SP.

The semiconductor region ACT1, the source electrode SE1, and the drain electrode DE1 of the first transistor ST1 may be located on the hydrogen passivation layer HPL. The semiconductor region ACT1 of the first transistor ST1 may overlap the gate electrode GE1 in the thickness direction, and may be insulated from the gate electrode GE1 by the capping layer CPL and the first gate insulating layer GI1. The source electrode SE1 and the drain electrode DE1 may be provided by making a material of the semiconductor region ACT1 conductive. The drain electrode DE1 of the first transistor ST1 may be electrically connected to the drain electrode DE3-2 of the third-second transistor ST3-2 through the second node N2 of FIG. 10.

The semiconductor region ACT3-1, the source electrode SE3-1, and the drain electrode DE3-1 of the third-first transistor ST3-1 may be located on the hydrogen passivation layer HPL. A part of the first metal layer BML1 may be the gate electrode GE3-1 of the third-first transistor ST3-1. The semiconductor region ACT3-1 of the third-first transistor ST3-1 may overlap the gate electrode GE3-1 in the thickness direction, and may be insulated from the gate electrode GE3-1 by the first buffer layer BF1 and the second buffer layer BF2. The source electrode SE3-1 and the drain electrode DE3-1 may be provided by making a material of the semiconductor region ACT3-1 conductive. The drain electrode DE3-1 of the third-first transistor ST3-1 may be integrally formed with the source electrode SE3-2 of the third-second transistor ST3-2. The drain electrode DE3-1 of the third-first transistor ST3-1 and the source electrode SE3-2 of the third-second transistor ST3-2 may overlap the first metal layer BML1, but embodiments according to the present disclosure are not limited thereto.

The semiconductor region ACT3-2, the source electrode SE3-2, and the drain electrode DE3-2 of the third-second transistor ST3-2 may be located on the hydrogen passivation layer HPL. Another part of the first metal layer BML1 may be the gate electrode GE3-2 of the third-second transistor ST3-2. The semiconductor region ACT3-2 of the third-second transistor ST3-2 may overlap the gate electrode GE3-2 in the thickness direction, and may be insulated from the gate electrode GE3-2 by the first buffer layer BF1 and the second buffer layer BF2. The source electrode SE3-2 and the drain electrode DE3-2 may be provided by making a material of the semiconductor region ACT3-2 conductive.

The capping layer CPL may be located on the semiconductor region ACT1, the source electrode SE1, and the drain electrode DE1 of the first transistor ST1, the semiconductor region ACT3-1, the source electrode SE3-1, and the drain electrode DE3-1 of the third-first transistor ST3-1, and the semiconductor region ACT3-2, the source electrode SE3-2, and the drain electrode DE3-2 of the third-second transistor ST3-2. In plan view, the capping layer CPL may have the same pattern as those of the semiconductor region ACT1, the source electrode SE1, and the drain electrode DE1 of the first transistor ST1, the semiconductor region ACT3-1, the source electrode SE3-1, and the drain electrode DE3-1 of the third-first transistor ST3-1, and the semiconductor region ACT3-2, the source electrode SE3-2, and the drain electrode DE3-2 of the third-second transistor ST3-2. The capping layer CPL may cover the protrusions formed on the semiconductor region ACT1, the source electrode SE1, and the drain electrode DE1 of the first transistor ST1. When the semiconductor region ACT1 of the first transistor ST1 includes low temperature polycrystalline silicon (LTPS), the amorphous silicon layer provided on the substrate SUB may be melted and crystallized by laser. In this case, grains may grow by crystallization of the amorphous silicon layer, and protrusions may be formed at grain boundaries between grains. The capping layer CPL covers the protrusions of the first transistor ST1 to prevent or reduce instances of an electric field being concentrated on the protrusions when the first transistor ST1 is driven, and may improve the driving range of the first transistor ST1. Accordingly, in the display device 10, because the capping layer CPL is included, it may be possible to precisely control the gray scale of light emitted from the light emitting element ED. The capping layer CPL may include at least one of a silicon nitride layer, a silicon oxynitride layer, a silicon oxide layer, a titanium oxide layer, an aluminum oxide layer, or an amorphous silicon layer, but embodiments according to the present disclosure are not limited thereto.

In the case of forming the first gate insulating layer GI1 by a deposition process, the thickness of the first gate insulating layer GI1 on the hydrogen passivation layer HPL and the thickness of the first gate insulating layer GI1 on the capping layer CPL may be substantially the same. A first thickness T1 may be larger than a second thickness T2. Here, the first thickness T1 may be the sum of the thickness of the capping layer CPL and the thickness of the first gate insulating layer GI1 overlapping each other, and the second thickness T2 may be the thickness of the first gate insulating layer GI1 that does not overlap the capping layer CPL. The thickness of the capping layer CPL may be determined by the difference between the first thickness T1 and the second thickness T2. The capping layer CPL may have a thickness of about 20 to about 200 angstroms (Å), and preferably about 100 angstroms (Å). Therefore, even when the first gate insulating layer GI1 and the capping layer CPL include the same material, the capping layer CPL may be located on the first transistor ST1, the third-first transistor ST3-1, and the third-second transistor ST3-2 to cover the protrusions of the first transistor ST1, the third-first transistor ST3-1, and the third-second transistor ST3-2.

The first bias electrode BE1, the second bias electrode BE2, and the gate electrode GE1 of the first transistor ST1 may be located on the first gate insulating layer GI1. The first bias electrode BE1, the second bias electrode BE2, and the gate electrode GE1 of the first transistor ST1 may be made of the same material on the same layer, but embodiments according to the present disclosure are not limited thereto.

The first bias electrode BE1 may be the bias electrode of the third-first transistor ST3-1. The first bias electrode BE1 may overlap the semiconductor region ACT3-1 of the third-first transistor ST3-1. The first bias electrode BE1 may be electrically connected to the driving voltage line VDDL, and may receive the driving voltage from the driving voltage line VDDL. Accordingly, the first bias electrode BE1 may stabilize the electric field of the third-first transistor ST3-1 and improve output characteristics.

The second bias electrode BE2 may be the bias electrode of the third-second transistor ST3-2. The second bias electrode BE2 may overlap the semiconductor region ACT3-2 of the third-second transistor ST3-2. The second bias electrode BE2 may be inserted into the contact hole provided in the first gate insulating layer GI1, the hydrogen passivation layer HPL, the second buffer layer BF2, and the first buffer layer BF1 to be electrically connected to the first metal layer BML1. The second bias electrode BE2 may receive the second gate signal GC[n] from the second gate line GCL. Accordingly, the second bias electrode BE2 may increase the electric field caused by the second gate signal GC[n] to improve output characteristics of the third-second transistor ST3-2.

The first connection electrode CNE1 may be located on the interlayer insulating layer ILD. The first connection electrode CNE1 may be inserted into the contact hole provided in the interlayer insulating layer ILD and the second gate insulating layer GI2 to be in contact with the first bias electrode BE1. The first connection electrode CNE1 may be electrically connected between the first bias electrode BE1 and the driving voltage line VDDL. Accordingly, the first connection electrode CNE1 may supply the driving voltage received from the driving voltage line VDDL to the first bias electrode BE1.

The third connection electrode CNE3 may be located to be spaced apart from the first connection electrode CNE1 on the interlayer insulating layer ILD. The third connection electrode CNE3 may electrically connect the pixel circuit of the pixel SP and the anode connection electrode ANE. For example, the third connection electrode CNE3 may be electrically connected to the fourth node N4 of FIG. 10. Accordingly, the third connection electrode CNE3 may supply the driving current received from the pixel circuit of the pixel SP to the light emitting element ED.

The sixth connection electrode CNE6 may be located to be spaced apart from the first and third connection electrodes CNE1 and CNE3 on the interlayer insulating layer ILD. The sixth connection electrode CNE6 may be inserted into the contact hole provided in the interlayer insulating layer ILD, the second gate insulating layer GI2, the first gate insulating layer GI1, the hydrogen passivation layer HPL, the second buffer layer BF2, and the first buffer layer BF1 to be in contact with the third metal layer BML3. The sixth connection electrode CNE6 may be electrically connected between the third metal layer BML3 and the driving voltage line VDDL. Accordingly, the sixth connection electrode CNE6 may supply the driving voltage received from the driving voltage line VDDL to the third metal layer BML3.

What is claimed is:

1. A display device comprising:
a light emitting element on a substrate;
a first transistor configured to control a driving current flowing through the light emitting element;
a second transistor configured to supply a data voltage to a source electrode of the first transistor;
a third-first transistor and a third-second transistor connected in series between a gate electrode of the first transistor and a drain electrode of the first transistor;
a first metal layer on the substrate and comprising a gate electrode of the third-first transistor and a gate electrode of the third-second transistor;
a hydrogen passivation layer on the first metal layer;
a semiconductor region of each of the first transistor, the third-first transistor, and the third-second transistor on the hydrogen passivation layer;
a capping layer on the semiconductor region of the first transistor;
a gate electrode of the first transistor on the capping layer;
a first bias electrode on a same layer as the gate electrode of the first transistor and overlapping the semiconductor region of the third-first transistor; and
a second bias electrode on a same layer as the first bias electrode and overlapping the semiconductor region of the third-second transistor.

2. The display device of claim 1, wherein the hydrogen passivation layer directly contacts a bottom surface of the semiconductor region of each of the first transistor, the third-first transistor, and the third-second transistor.

3. The display device of claim 1, wherein the first and second bias electrodes are electrically connected to a driving voltage line to receive a driving voltage.

4. The display device of claim 1, further comprising:
a fourth-first transistor and a fourth-second transistor connected in series between the gate electrode of the first transistor and a first initialization voltage line; and
a second metal layer on a same layer as the first metal layer and comprising a gate electrode of the fourth-first transistor and a gate electrode of the fourth-second transistor.

5. The display device of claim 4, wherein the gate electrode of the second transistor is configured to receive a first gate signal from a first gate line, and
the first metal layer is configured to receive a second gate signal different from the first gate signal from a second gate line.

6. The display device of claim 5, wherein the second metal layer is configured to receive a third gate signal different from the first and second gate signals from a third gate line.

7. The display device of claim 4, further comprising:
a third bias electrode on a same layer as the second bias electrode and overlapping a semiconductor region of the fourth-first transistor; and
a fourth bias electrode on a same layer as the third bias electrode and overlapping a semiconductor region of the fourth-second transistor.

8. The display device of claim 7, wherein the third and fourth bias electrodes are electrically connected to a driving voltage line to receive a driving voltage.

9. The display device of claim 4, further comprising:
a fifth transistor between the source electrode of the first transistor and a driving voltage line;
a sixth transistor between the drain electrode of the first transistor and the light emitting element; and
a seventh transistor between a first electrode of the light emitting element and a second initialization voltage line.

10. The display device of claim 9, further comprising an eighth transistor between the source electrode of the first transistor and a bias voltage line.

11. The display device of claim 1, wherein the first transistor comprises a protrusion formed on a semiconductor region, a source electrode, and a drain electrode of the first transistor, and
the capping layer covers the protrusion of the first transistor.

12. The display device of claim 11, further comprising a gate insulating layer between the capping layer and the gate electrode of the first transistor,
wherein the capping layer includes a silicon oxide layer or an amorphous silicon layer, and
the gate insulating layer includes at least one of a silicon nitride layer, a silicon oxynitride layer, a silicon oxide layer, a titanium oxide layer, an aluminum oxide layer, or an amorphous silicon layer.

13. A display device comprising:
a light emitting element on a substrate;
a first transistor configured to control a driving current flowing through the light emitting element;
a second transistor configured to supply a data voltage to a source electrode of the first transistor;
a third-first transistor and a third-second transistor connected in series between a gate electrode of the first transistor and a drain electrode of the first transistor;
a first metal layer on the substrate and comprising a gate electrode of the third-first transistor and a gate electrode of the third-second transistor;
a hydrogen passivation layer on the first metal layer;
a semiconductor region of each of the first transistor, the third-first transistor, and the third-second transistor on the hydrogen passivation layer;
a capping layer on the semiconductor region of the first transistor;
a gate electrode of the first transistor on the capping layer;
a first bias electrode on a same layer as the gate electrode of the first transistor and overlapping the semiconductor region of the third-first transistor; and
a second bias electrode on a same layer as the first bias electrode, overlapping the semiconductor region of the third-second transistor, and electrically connected to the first metal layer.

14. The display device of claim 13, wherein the first bias electrode is electrically connected to a driving voltage line to receive a driving voltage.

15. The display device of claim 13, wherein the gate electrode of the second transistor is configured to receive a first gate signal from a first gate line, and
the first metal layer and the second bias electrode are configured to receive a second gate signal different from the first gate signal from a second gate line.

16. The display device of claim 13, further comprising a second metal layer on a same layer as the first metal layer and overlapping the semiconductor region of the first transistor.

17. The display device of claim 16, wherein the second metal layer is electrically connected to a driving voltage line to receive a driving voltage.

18. A display device comprising:
a light emitting element on a substrate;
a first transistor configured to control a driving current flowing through the light emitting element;
a second transistor configured to supply a data voltage to a source electrode of the first transistor;
a third-first transistor and a third-second transistor connected in series between a gate electrode of the first transistor and a drain electrode of the first transistor;
a first metal layer on the substrate and comprising a gate electrode of the third-first transistor and a gate electrode of the third-second transistor;
a semiconductor region of each of the first transistor, the third-first transistor, and the third-second transistor on the first metal layer;
a gate electrode of the first transistor on the semiconductor region of the first transistor; and
a first bias electrode on a same layer as the gate electrode of the first transistor, overlapping the semiconductor region of the third-first transistor, and electrically connected to a driving voltage line,
wherein the gate electrode of the first transistor is electrically connected to a source electrode of the third-first transistor on a same layer as the semiconductor region of the third-first transistor.

19. The display device of claim 18, further comprising:
a fourth-first transistor and a fourth-second transistor connected in series between the gate electrode of the first transistor and a first initialization voltage line; and
a second metal layer on a same layer as the first metal layer and comprising a gate electrode of the fourth-first transistor and a gate electrode of the fourth-second transistor,
wherein the gate electrode of the first transistor is electrically connected to the source electrode of the fourth-first transistor on the same layer as the semiconductor region of the fourth-first transistor.

20. The display device of claim 18, further comprising a third metal layer on a same layer as the first metal layer, overlapping the semiconductor region of the first transistor, and electrically connected to a driving voltage line.

* * * * *